(12) United States Patent
Kim et al.

(10) Patent No.: US 12,119,369 B2
(45) Date of Patent: Oct. 15, 2024

(54) DISPLAY DEVICE

(71) Applicant: Samsung Display Co., LTD., Yongin-si (KR)

(72) Inventors: Seul Ki Kim, Yongin-si (KR); Seon Beom Ji, Yongin-si (KR); Tae Ha Jin, Yongin-si (KR); Dong Hwan Kim, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 520 days.

(21) Appl. No.: 17/469,238

(22) Filed: Sep. 8, 2021

(65) Prior Publication Data
US 2022/0254830 A1    Aug. 11, 2022

(30) Foreign Application Priority Data

Feb. 9, 2021  (KR) .......................... 10-2021-0018618

(51) Int. Cl.
| | | |
|---|---|---|
| *H01L 27/15* | (2006.01) | |
| *H01L 33/24* | (2010.01) | |
| *H01L 33/38* | (2010.01) | |
| *H01L 33/44* | (2010.01) | |

(52) U.S. Cl.
CPC ............ *H01L 27/156* (2013.01); *H01L 33/24* (2013.01); *H01L 33/38* (2013.01); *H01L 33/44* (2013.01)

(58) Field of Classification Search
CPC ..... H01L 27/156; H01L 27/124; H01L 33/24; H01L 33/38; H01L 33/44; H01L 33/62; H01L 33/36; H01L 25/167; H01L 25/0753; G09G 3/006
See application file for complete search history.

(56) References Cited

U.S. PATENT DOCUMENTS

2020/0135971 A1* 4/2020 Beak ...................... H01L 27/156
2022/0375906 A1* 11/2022 Kim ......................... G09G 3/32

FOREIGN PATENT DOCUMENTS

| KR | 10-0543714 | 1/2006 |
|---|---|---|
| KR | 10-2020-0026385 | 3/2020 |
| KR | 10-2020-0032809 | 3/2020 |

* cited by examiner

*Primary Examiner* — Sitaramarao S Yechuri
(74) *Attorney, Agent, or Firm* — KILE PARK REED & HOUTTEMAN PLLC

(57) ABSTRACT

A display device includes a light emitting area, a non-light emitting area surrounding the light emitting area, and a separation area spaced apart from the light emitting area, the non-light emitting area disposed between the light emitting area and the separation area; a bank disposed in the non-light emitting area; a first alignment electrode and a second alignment electrode that extend from the light emitting area through the non-light emitting area to the separation area; light emitting elements electrically connected to at least one of the first alignment electrode and the second alignment electrode; a first contact electrode disposed in the separation area and electrically connected to the first alignment electrode; and a second contact electrode disposed in the separation area and electrically connected to the second alignment electrode.

20 Claims, 12 Drawing Sheets

DISPLAY DEVICE

CROSS-REFERENCE TO RELATED APPLICATION(S)

This application claims priority to and benefits of Korean Patent Application No. 10-2021-0018618 under 35 U.S.C. § 119 filed on Feb. 9, 2021 in the Korean Intellectual Property Office, the entire contents of which are incorporated herein by reference.

BACKGROUND

1. Technical Field

The disclosure relates to a display device.

2. Description of the Related Art

Recently, as interest in display devices is increasing research and development for the display devices are continuously conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device that may detect defective pixels without damaging electrodes.

The objects of the disclosure are not limited to the objects mentioned above, and other technical objects that are not mentioned may be clearly understood to a person of an ordinary skill in the art using the following description.

An embodiment provides a display device that may include a light emitting area, a non-light emitting area surrounding the light emitting area, and a separation area spaced apart from the light emitting area, the non-light emitting area disposed between the light emitting area and the separation area; a bank disposed in the non-light emitting area; a first alignment electrode and a second alignment electrode that extend from the light emitting area through the non-light emitting area to the separation area; light emitting elements electrically connected to at least one of the first alignment electrode and the second alignment electrode; a first contact electrode disposed in the separation area and electrically connected to the first alignment electrode; and a second contact electrode disposed in the separation area and electrically connected to the second alignment electrode.

The first contact electrode and the second contact electrode may be disposed on a same layer.

The display device may further include a first electrode that electrically connects the first alignment electrode to the light emitting elements; and a second electrode that electrically connects the second alignment electrode to the light emitting elements.

The first electrode and the second electrode may be disposed on a same layer.

The first electrode and the first contact electrode may be disposed on different layers.

The first electrode and the second electrode may extend from the light emitting area through the non-light emitting area to the separation area.

The display device may further include an insulation layer disposed between the first alignment electrode and the first electrode.

The first contact electrode may be electrically connected to the first alignment electrode through a contact hole penetrating the insulation layer.

The first electrode and the first contact electrode may be disposed on a same layer.

The display device may further include a third alignment electrode and a fourth alignment electrode that extend from the light emitting area through the non-light emitting area to the separation area, wherein the light emitting elements may be electrically connected to at least one of the third alignment electrode and the fourth alignment electrode.

The display device may further include a third electrode that electrically connects the third alignment electrode to the light emitting elements; and a fourth electrode that electrically connects the fourth alignment electrode to the light emitting elements.

The display device may further include an insulation layer disposed between the first electrode and the third electrode.

The first contact electrode may be electrically connected to the first alignment electrode through a contact hole penetrating the insulation layer.

The insulation layer may include an opening exposing the first contact electrode.

The third electrode and the fourth electrode may be disposed on a same layer.

The third electrode and the first contact electrode may be disposed on a same layer.

The display device may further include a third contact electrode disposed in the non-light emitting area and electrically connected to the third alignment electrode; and a fourth contact electrode disposed in the non-light emitting area and electrically connected to the fourth alignment electrode.

The third contact electrode and the fourth contact electrode may be disposed on a same layer.

The third contact electrode and the first contact electrode may be disposed on a same layer.

The third contact electrode and the third electrode may be disposed on a same layer.

Further details of other embodiments are included in the detailed description and drawings.

According to an embodiment, it is possible to detect a disconnection or short-circuit defect by measuring a resistance of each pixel through contact electrodes disposed in a separation area. Accordingly, since a change in resistance may be detected without directly contacting alignment electrodes, it is possible to prevent the alignment electrodes from being damaged in a process of measuring the resistance of the pixel. By disposing the contact electrodes in the separation area outside of a light emitting area, an additional space for forming the contact electrodes is unnecessary, so that a high resolution display device may be readily implemented.

Effects of embodiments of the disclosure are not limited by what is illustrated in the above, and more various effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
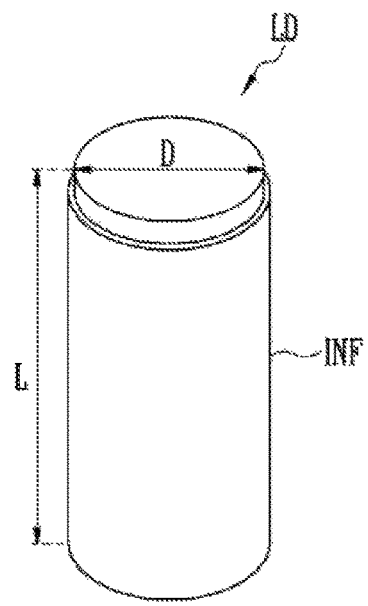
FIG. 1 and FIG. 2 illustrate a schematic perspective view and a schematic cross-sectional view of a light emitting element according to an embodiment, respectively.

Advantages and features of the disclosure and methods of accomplishing the same may be understood more readily by reference to the following detailed description of embodiments and the accompanying drawings. The disclosure may, however, be embodied in different forms and should not be construed as limited to the embodiments set forth herein. The embodiments are provided so that this disclosure will be thorough and complete, and will fully convey the scope of the disclosure to those skilled in the art, and further, the disclosure is defined by scopes of the claims.

The terms used herein are for the purpose of describing particular embodiments only and is not intended to be limiting. As used herein, the singular forms "a", "an" and "the" are intended to include the plural forms as well, unless the context clearly indicates otherwise. It will be further understood that the terms "comprise" and/or "comprising", "include" or "including", and "have" or "having", and variations thereof when used in the disclosure, specify the presence of stated elements, steps, operations, and/or devices, but do not preclude the presence or addition of one or more other elements, steps, operations, and/or devices.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The term "connection" or "coupling" may comprehensively mean a physical and/or electrical connection or coupling. Further, this may comprehensively mean a direct or indirect connection or coupling, and an integrated or non-integrated connection or coupling.

It will be understood that when an element or a layer is referred to as being 'on' another element or layer, it can be directly on another element or layer, or intervening element or layer may also be present. Throughout the specification, the same reference numerals denote the same constituent elements.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

Although the terms "first", "second", and the like are used to describe various constituent elements, these constituent elements are not limited by these terms. These terms are used only to distinguish one constituent element from another constituent element. Therefore, the first constituent elements described below may be the second constituent elements within the technical spirit of the disclosure.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the disclosure will be described in detail with reference to the accompanying drawings.

Figure 2:
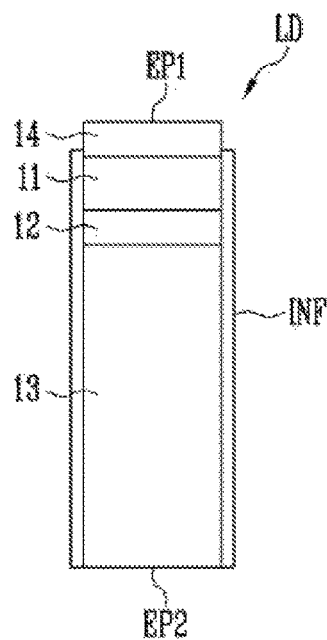

FIG. 1 and FIG. 2 illustrate a schematic perspective view and a schematic cross-sectional view of a light emitting element according to an embodiment, respectively. FIG. 1 and FIG. 2 illustrate a substantially cylindrical shape light emitting element LD, but a type and/or shape of the light emitting element LD is not limited thereto.

Referring to FIG. 1 and FIG. 2, a light emitting element LD may include a first semiconductor layer 11, an active layer 12, a second semiconductor layer 13, and/or an electrode layer 14.

The light emitting element LD may be formed to have a substantially cylindrical shape extending along one direction or a direction. The light emitting element LD may have a first end portion EP1 and a second end portion EP2. One of the first and second semiconductor layers 11 and 13 may be disposed on the first end portion EP1 of the light emitting element LD. The remaining one of the first and second semiconductor layers 11 and 13 may be disposed on the second end portion EP2 of the light emitting element LD. For example, the first semiconductor layer 11 may be disposed on the first end portion EP1 of the light emitting element LD, and the second semiconductor layer 13 may be disposed on the second end EP2 of the light emitting element LD.

In an embodiment, the light emitting element LD may be a light emitting element manufactured in a substantially cylindrical shape through an etching method or the like within the spirit and the scope of the disclosure. In the specification, the "substantially cylindrical shape" may include a rod-like shape or bar-like shape with an aspect ratio greater than 1, such as substantially a circular cylinder or substantially a polygonal cylinder, but a shape of a cross-section thereof is not limited.

The light emitting element LD may have a size as small as a nanometer scale to a micrometer scale. For example, the light emitting element LD may each have a diameter D (or width) and/or a length L ranging from a nanometer scale to a micrometer scale. However, the size of the light emitting element LD is not limited thereto, and the size of the light emitting element LD may be variously changed according to design conditions of various devices using a light emitting device using the light emitting element LD as a light source, for example, a display device.

The first semiconductor layer 11 may be a first conductive semiconductor layer. For example, the first semiconductor layer 11 may include a p-type semiconductor layer. For example, the first semiconductor layer 11 may include at least one semiconductor material of InAlGaN, GaN, AlGaN, InGaN, AlN, and InN, and may include a p-type semiconductor layer doped with a first conductive dopant such as Mg. However, the material included in the first semiconductor layer 11 is not limited thereto, and the first semiconductor layer 11 may be made of various materials.

The active layer 12 may be disposed between the first semiconductor layer 11 and the second semiconductor layer 13, and may be formed to have a single-quantum or multi-quantum well structure. A position of the active layer 12 may be variously changed according to a type of the light emitting element LD. In an embodiment, a material such as AlGaN and InAlGaN may be used to form the active layer 12, and in addition, various materials may form the active layer 12. A clad layer (not shown) doped with a conductive dopant may be formed at an upper portion and/or a lower portion of the active layer 12. For example, the cladding layer may be formed of AlGaN or InAlGaN.

The second semiconductor layer 13 is disposed to on the active layer 12, and may include a semiconductor layer of a type different from that of the first semiconductor layer 11. The second semiconductor layer 13 may include an n-type semiconductor layer. For example, the second semiconductor layer 13 may include a semiconductor material of one of InAlGaN, GaN, AlGaN, InGaN, AlN, and InN, and may include an n-type semiconductor layer doped with a second conductive dopant such as Si, Ge, Sn, or the like within the spirit and the scope of the disclosure. However, the material included in the second semiconductor layer 13 is not limited thereto, and the second semiconductor layer 13 may be made of various materials.

In case that a voltage of a threshold voltage or more is applied to respective ends of the light emitting element LD, the light emitting device LD emits light while electron-hole pairs are combined in the active layer 12. By controlling the light emission of the light emitting element LD by using this principle, the light emitting element LD may be used as a light source for various light emitting devices in addition to pixels of a display device.

The electrode layer 14 may be disposed on the first end portion EP1 and/or the second end portion EP2 of the light emitting element LD. FIG. 2 illustrates the case in which the electrode layer 14 is formed on the first semiconductor layer 11, but the disclosure is not necessarily limited thereto. For example, a separate electrode layer may be further disposed on the second semiconductor layer 13.

The electrode layer 14 may include a transparent metal or transparent metal oxide. As an example, the electrode layer 14 may include at least one of an indium tin oxide (ITO), an indium zinc oxide (IZO), a zinc oxide (ZnO), and a zinc tin oxide (ZTO), but is not limited thereto. As such, in case that the electrode layer 14 is made of the transparent metal or transparent metal oxide, light generated in the active layer 12 of the light emitting element LD may transmit through the electrode layer 14 to be emitted to the outside of the light emitting element LD.

The light emitting element LD may further include an insulation film INF formed on a surface thereof. The insulation film INF may be disposed on or directly disposed on surfaces of the first semiconductor layer 11, the active layer 12, the second semiconductor layer 13, and/or the electrode layer 14. The insulation film INF may expose the first and second end portions EP1 and EP2 of the light emitting element LD having different polarities. In an embodiment, the insulation film INF may expose side portions of the electrode layer 14 and/or the second semiconductor layer 13 that are adjacent to the first and second end portions EP1 and EP2 of the light emitting element LD.

The insulation film INF may include at least one of an aluminum oxide ($AlO_x$), an aluminum nitride ($AlN_x$), a silicon oxide ($SiO_x$), a silicon nitride ($SiN_x$), a silicon oxynitride ($SiO_xN_y$), a zirconium oxide ($ZrO_x$), a hafnium oxide ($HfO_x$), and a titanium oxide ($TiO_x$). For example, the insulation film INF may be formed as a double layer, and respective layers forming the double layer may include different materials. Respective layers forming the double layer of the insulation film INF may be formed by different processes. In the embodiment, the insulation film INF may be formed as a double layer made of an aluminum oxide ($AlO_x$) and a silicon oxide ($SiO_x$), but is not limited thereto. In an embodiment, the insulation film INF may be omitted.

In case that the insulation film INF is provided or disposed on a surface of the light emitting element LD, it is possible to prevent the active layer 12 from being short-circuited with at least one electrode (for example, at least one of electrodes electrically connected to respective ends of the light emitting element LD). Therefore, electrical stability of the light emitting element LD may be secured. Further, it is possible to improve the life-span and efficiency of the light emitting element LD by minimizing surface-defects of the light emitting element LD.

A light emitting device including the light emitting element LD described above may be used in various types of devices that require a light source in addition to a display device. For example, the light emitting elements LD may be disposed in each pixel of a display panel, and the light emitting elements LD may be used as a light source of each pixel. However, an application field of the light emitting element LD is not limited to the above-described example. For example, the light emitting element LD may be used in other types of devices that require a light source, such as a lighting device.

Figure 3:
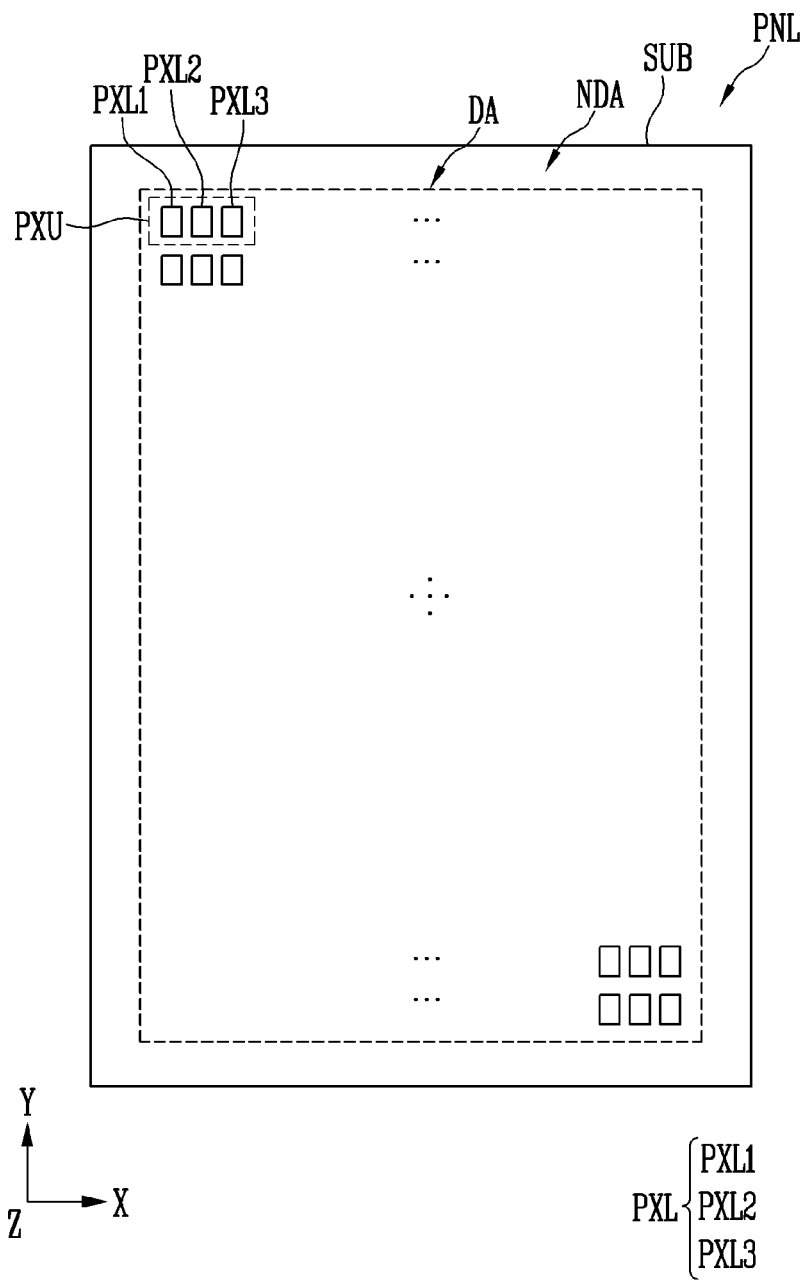
FIG. 3 illustrates a schematic top plan view of a display device according to an embodiment.

FIG. 3 illustrates a schematic top plan view of a display device according to an embodiment.

FIG. 3 illustrates a display device, for example, a display panel PNL provided or disposed in the display device as an example of an electronic device that may use the light emitting element LD described in the embodiments of FIG. 1 and FIG. 2 as a light source.

Each pixel unit PXU of the display panel PNL and each pixel forming the same may include at least one light emitting element LD. For better understanding and ease of description, FIG. 3 briefly illustrates the structure of the display panel PNL based on a display area DA. However, in an embodiment, at least one driving circuit portion (for example, at least one of a scan driver and a data driver), wires, and/or pads, which are not shown, may be further disposed in the display panel PNL.

Referring to FIG. 3, the display panel PNL may include a substrate SUB and the pixel unit PXU disposed on the substrate SUB. The pixel unit PXU may include first pixels PXL1, second pixels PXL2, and/or third pixels PXL3. Hereinafter, in case that arbitrarily referring to one or more pixels among the first pixels PXL1, the second pixels PXL2, and the third pixels PXL3, or in case that comprehensively referring to two or more types of pixels, they will be referred to as a "pixel PXL" or "pixels PXL".

The substrate SUB forms a base member of the display panel PNL, and may be a rigid or flexible substrate or film. For example, the substrate SUB may be formed as a rigid substrate made of glass or tempered glass and as a flexible substrate made of a plastic or metallic material (or a thin film), but the material and/or physical properties of the substrate SUB are not particularly limited.

The display panel PNL and the substrate SUB for forming the display panel include a display area DA for displaying an image and a non-display area NDA excluding the display area DA. The pixels PXL may be disposed in the display area DA. In the non-display area NDA, various wires connected to the pixels PXL of the display area DA, pads, and/or internal circuit parts may be disposed. The pixels PXL may be regularly arranged or disposed according to a stripe or PenTile® arrangement structure. However, the arrangement structure of the pixels PXL is not limited thereto, and the pixels PXL may be arranged or disposed in the display area DA in various structures and/or methods.

In an embodiment, two or more types of pixels PXL emitting light of different colors may be disposed in the display area DA. For example, in the display area DA, the first pixels PXL1 emitting light of the first color, the second pixels PXL2 emitting light of the second color, and the third pixels PXL3 emitting light of the third color may be arranged or disposed. At least one first to third pixels PXL1, PXL2, and PXL3 disposed to be adjacent to each other may form one pixel unit PXU that may emit light of various colors. For example, each of the first to third pixels PXL1, PXL2, and PXL3 may be a sub-pixel that emits light of a color. According to the embodiment, the first pixel PXL1 may be a red pixel that emits red light, the second pixel PXL2 may be a green pixel that emits green light, and the third pixel PXL3 may be a blue pixel that emits blue light, but the disclosure is not limited thereto.

In the embodiment, the first pixel PXL1, the second pixel PXL2, and the third pixel PXL3 are provided with light emitting elements of a same color, and include color conversion layers and/or color filters of different colors disposed on respective light emitting elements, so that they may emit light of the first color, the second color, and the third color, respectively. In an embodiment, the first pixel PXL1, the second pixel PXL2, and the third pixel PXL3 are each provided with a first color light emitting element, a second color light emitting element, and a third color light emitting element as a light source, respectively, so that they respectively emit light of the first color, second color, and third color. However, the color, type, and/or number of pixels PXL forming each pixel unit PXU are not particularly limited. For example, the color of light emitted by each pixel PXL may be variously changed.

The pixel PXL may include at least one light source driven by a control signal (for example, a scan signal and a data signal) and/or a power source (for example, a first power source and a second power source). In the embodiment, the light source may include at least one light emitting device LD according to one of the embodiments of FIG. 1 and FIG. 2, for example, ultra-small substantially cylindrical shape light emitting elements LD having a size as small as nanometer scale to micrometer scale. However, the disclosure is not limited thereto, and various types of light emitting elements LD may be used as a light source of the pixel PXL.

In the embodiment, each pixel PXL may be formed as an active pixel. However, the type, structure, and/or driving method of pixels PXL that may be applied to the display device are not particularly limited. For example, each pixel PXL may be formed as a pixel of a passive or active light emitting display device of various structures and/or driving methods.

Figure 4:
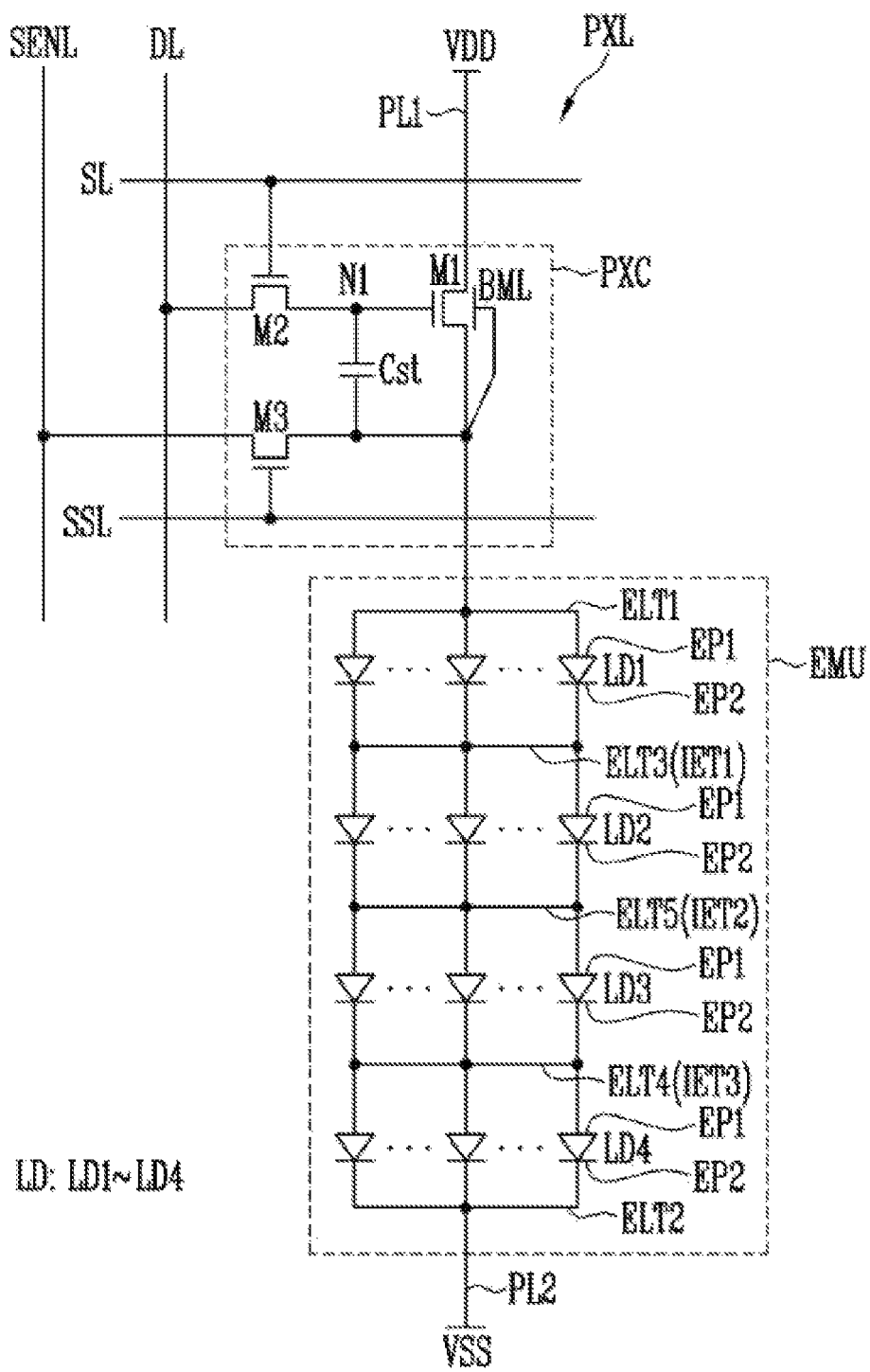
FIG. 4 illustrates a schematic diagram of an equivalent circuit of a pixel according to an embodiment.

FIG. 4 illustrates a schematic diagram of an equivalent circuit of a pixel according to an embodiment.

In an embodiment, the pixel PXL shown in FIG. 4 may be one of the first pixel PXL1, the second pixel PXL2, and the third pixel PXL3 provided or disposed in the display panel PNL of FIG. 3. The first pixel PXL1, the second pixel PXL2, and the third pixel PXL3 may have substantially the same or similar structure.

Referring to FIG. 4, the pixel PXL may further include a light emitting part EMU for generating light at luminance corresponding to a data signal, and a pixel circuit PXC for driving a light emitting part EMU.

The pixel circuit PXC may be electrically connected between a first power source VDD and the light emitting part EMU. The pixel circuit PXC may be electrically connected to a scan line SL and a data line DL of the pixel PXL to control an operation of the light emitting part EMU in response to a scan signal and a data signal supplied from the scan line SL and the data line DL. The pixel circuit PXC may be further selectively connected to a sensing signal line SSL and a sensing line SENL.

The pixel circuit PXC may include at least one transistor and a capacitor. For example, the pixel circuit PXC may include a first transistor M1, a second transistor M2, a third transistor M3, and a storage capacitor Cst.

The first transistor M1 may be electrically connected between the first power source VDD and a first electrode ELT1. A gate electrode of the first transistor M1 may be electrically connected to a first node N1. The first transistor M1 may control a driving current supplied to the light emitting part EMU in response to a voltage of the first node N1. For example, the first transistor M1 may be a driving transistor that controls a driving current of the pixel PXL.

In the embodiment, the first transistor M1 may optionally include a bottom metal layer BML (also referred to as a "lower electrode", "back gate electrode", or "lower light blocking layer"). The gate electrode of the first transistor M1 and the bottom metal layer BML may overlap each other with an insulation layer interposed therebetween. In the embodiment, the bottom metal layer BML may be electrically connected to one electrode of the first transistor M1, for example a source or drain electrode thereof.

In case that the first transistor M1 may include the bottom metal layer BML, by applying a back-biasing voltage to the bottom metal layer BML of the first transistor M1 in case that the pixel PXL is driven, a back-biasing technique (or a sync technique) of moving a threshold voltage of the first transistor M1 in a negative or positive direction may be applied. For example, by connecting the bottom metal layer BML to the source electrode of the first transistor M1 to apply a source-sync technique, the threshold voltage of the first transistor M1 may be moved in the negative or positive direction. In case that the bottom metal layer BML is disposed under or below a semiconductor pattern forming a channel of the first transistor M1, the bottom metal layer BML may serve as a light blocking pattern to stabilize an operating characteristic of the first transistor M1. However, the function and/or utilization method of the bottom metal layer BML is not limited thereto.

The second transistor M2 may be electrically connected between the data line DL and the first node N1. A gate electrode of the second transistor M2 may be electrically connected to a scan line SL. In case that a scan signal of a gate-on voltage (for example, a high level voltage) is supplied from the scan line SL, the second transistor M2 may be turned on to electrically connect the data line DL and the first node N1.

For each frame period, a data signal of the corresponding frame is supplied to the data line DL, and the data signal be transmitted to the first node N1 through the turned-on second transistor M2 during a period in which the scan signal of the gate-on voltage is supplied. For example, the second transistor M2 may be a switching transistor for transmitting each data signal to the inside of the pixel PXL.

One electrode of the storage capacitor Cst may be electrically connected to the first node N1, and the other electrode thereof may be electrically connected to a second electrode of the first transistor M1. The storage capacitor Cst may be charged with a voltage corresponding to the data signal supplied to the first node N1 during each frame period.

The third transistor M3 may be electrically connected between the first electrode ELT1 (or the second electrode of the first transistor M1) and the sensing line SENL. A gate electrode of the third transistor M3 may be electrically connected to the sensing signal line SSL. The third transistor M3 may transmit a voltage applied to the first electrode ELT1 to the sensing line SENL according to a sensing signal supplied to the sensing signal line SSL. The voltage transmitted through the sensing line SENL may be provided to an external circuit (for example, a timing controller), and the external circuit may detect characteristic information (for example, a threshold voltage of the first transistor M1) of each pixel PXL based on the supplied voltage. The detected characteristic information may be used to convert image data so that a characteristic deviation between the pixels PXL is compensated.

In FIG. 4, all the transistors included in the pixel circuit PXC are illustrated as N-type transistors, but the disclosure is not limited thereto. For example, at least one of the first, second, and third transistors M1, M2, and M3 may be changed to a P-type transistor.

The structure and driving method of the pixel PXL may be variously changed. For example, the pixel circuit PXC may be formed as a pixel circuit having various structures and/or driving methods in addition to that of the embodiment shown in FIG. 4.

For example, the pixel circuit PXC may not include the third transistor M3. The pixel circuit PXC may further include other circuit elements such as a compensation transistor for compensating for a threshold voltage of the first transistor M1, an initialization transistor for initializing the voltage of the first node N1 and/or of the first electrode ELT1, a light emission control transistor for controlling a period in which a driving current is supplied to the light emitting unit EMU, and/or a boosting capacitor for boosting the voltage of the first node N1.

The light emitting part EMU may include at least one light emitting element LD electrically connected between the first power source VDD and a second power source VSS, for example, light emitting elements LD.

For example, the light emitting part EMU may include the first electrode ELT1 (also referred to as a "first electrode") electrically connected to the first power VDD through the pixel circuit PXC and a first power line PL1, a second pixel electrode ELT2 (also referred to as a "second electrode") electrically connected to the second power VSS through a second power line PL2, and light emitting elements LD electrically connected between the first and second electrodes ELT1 and ELT2.

The first and second power sources VDD and VSS may have different potentials so that the light emitting elements LD may emit light. For example, the first power source VDD may be set as a high potential power source, and the second power source VSS may be set as a low potential power source.

In an embodiment, the light emitting part EMU may include at least one serial stage. Each serial stage may include a pair of electrodes (for example, two electrodes) and at least one light emitting element LD electrically connected in a forward direction between the pair of electrodes. Here, the number of serial stages forming the light emitting part EMU and the number of light emitting elements LD forming each serial stage are not particularly limited. For example, the number of the light emitting elements LD forming respective serial stages may be the same or different from each other, but the number of the light emitting elements LD is not particularly limited.

For example, the light emitting part EMU may include a first serial stage including at least one first light emitting element LD1, a second serial stage including at least one second light emitting element LD2, a third serial stage including at least one third light emitting element LD3, and a fourth serial stage including at least one fourth light emitting element LD4.

The first serial stage may include the first electrode ELT1, the third electrode ELT3, and at least one first light emitting element LD1 electrically connected between the first and third electrodes ELT1 and ELT3. Each first light emitting element LD1 may be electrically connected in a forward direction between the first and third electrodes ELT1 and ELT3. For example, the first end portion EP1 of the first light emitting element LD1 may be electrically connected to the first electrode ELT1, and the second end portion EP2 of the first light emitting element LD1 may be electrically connected to the third electrode ELT3.

The second serial stage may include the third electrode ELT3, the fifth electrode ELT5, and at least one second light emitting element LD2 electrically connected between the third and fifth electrodes ELT3 and ELT5. Each second light emitting element LD2 may be electrically connected in a forward direction between the third and fifth electrodes ELT3 and ELT5. For example, the first end portion EP1 of the second light emitting element LD2 may be electrically connected to the third electrode ELT3, and the second end portion EP2 of the second light emitting element LD2 may be electrically connected to fifth electrode ELT5.

The third serial stage may include the fifth electrode ELT5, the fourth electrode ELT4, and at least one third light emitting element LD3 electrically connected between the fourth and fifth electrodes ELT4 and ELT5. Each third light emitting element LD3 may be electrically connected in a forward direction between the fourth and fifth electrodes ELT4 and ELT5. For example, the first end portion EP1 of the third light emitting element LD3 may be electrically connected to the fifth electrode ELT5, and the second end portion EP2 of the third light emitting element LD3 may be electrically connected to fourth electrode ELT4.

The fourth serial stage may include the fourth electrode ELT4, the second electrode ELT2, and at least one fourth light emitting element LD4 electrically connected between the second and fourth electrodes ELT2 and ELT4. Each fourth light emitting element LD4 may be electrically connected in a forward direction between the second and fourth electrodes ELT2 and ELT4. For example, the first end portion EP1 of the fourth light emitting element LD4 may be electrically connected to the fourth electrode ELT4, and the second end portion EP2 of the fourth light emitting element LD4 may be electrically connected to the second electrode ELT2.

A first electrode of the light emitting part EMU, for example, the first electrode ELT1 may be an anode electrode of the light emitting part EMU. A last electrode of the light emitting part EMU, for example, the second electrode ELT2 may be a cathode electrode of the light emitting part EMU.

The remaining electrodes of the light emitting part EMU, for example, a third electrode ELT3, a fourth electrode ELT4 and/or a fifth electrode ELT5, may form respective intermediate electrodes. For example, the third electrode ELT3 may form the first intermediate electrode IET1, the fifth electrode ELT5 may form the second intermediate electrode IET2, and the fourth electrode ELT4 may form the third intermediate electrode IET3.

In case that the light emitting elements LD are electrically connected in a serial/parallel structure, power efficiency may be improved compared with in case that the same number of light emitting elements LD are electrically connected only in parallel. In the pixel PXL in which the light emitting elements LD are electrically connected in a serial/parallel structure, even if a short circuit defect occurs at some or a part of the serial stages, since a luminance may be displayed through the light emitting elements LD in the remaining serial stages, the possibility of dark spot defects of the pixel PXL may be reduced. However, the disclosure is not limited thereto, and the light emitting part EMU may be formed by electrically connecting the light emitting elements LD only in series or only in parallel.

Each of the light emitting elements LD may include at least one electrode (for example, the first electrode ELT1), the first end portion EP1 (for example, a p-type end portion) electrically connected to the first power source VDD via the pixel circuit PXC and/or the first power line PL1, and the second end portion EP2 (for example, an p-type end portion) electrically connected to the second power source VSS via at least one other electrode (for example, the second electrode ELT2) and the second power line PL2. For example, the light emitting elements LD may be electrically connected in a forward direction between the first power source VDD and the second power source VSS. The light emitting elements LD electrically connected to the forward direction may form the effective light sources of the light emitting part EMU.

In case that a driving current is supplied through the corresponding pixel circuit PXC, the light emitting elements LD may emit light with luminance corresponding to the driving current. For example, during each frame period, the pixel circuit PXC may supply a driving current corresponding to a gray value to be displayed in the corresponding frame to the light emitting part EMU. Accordingly, while the light emitting elements LD emit light with luminance corresponding to the driving current, the light emitting part EMU may display the luminance corresponding to the driving current.

Figure 5:
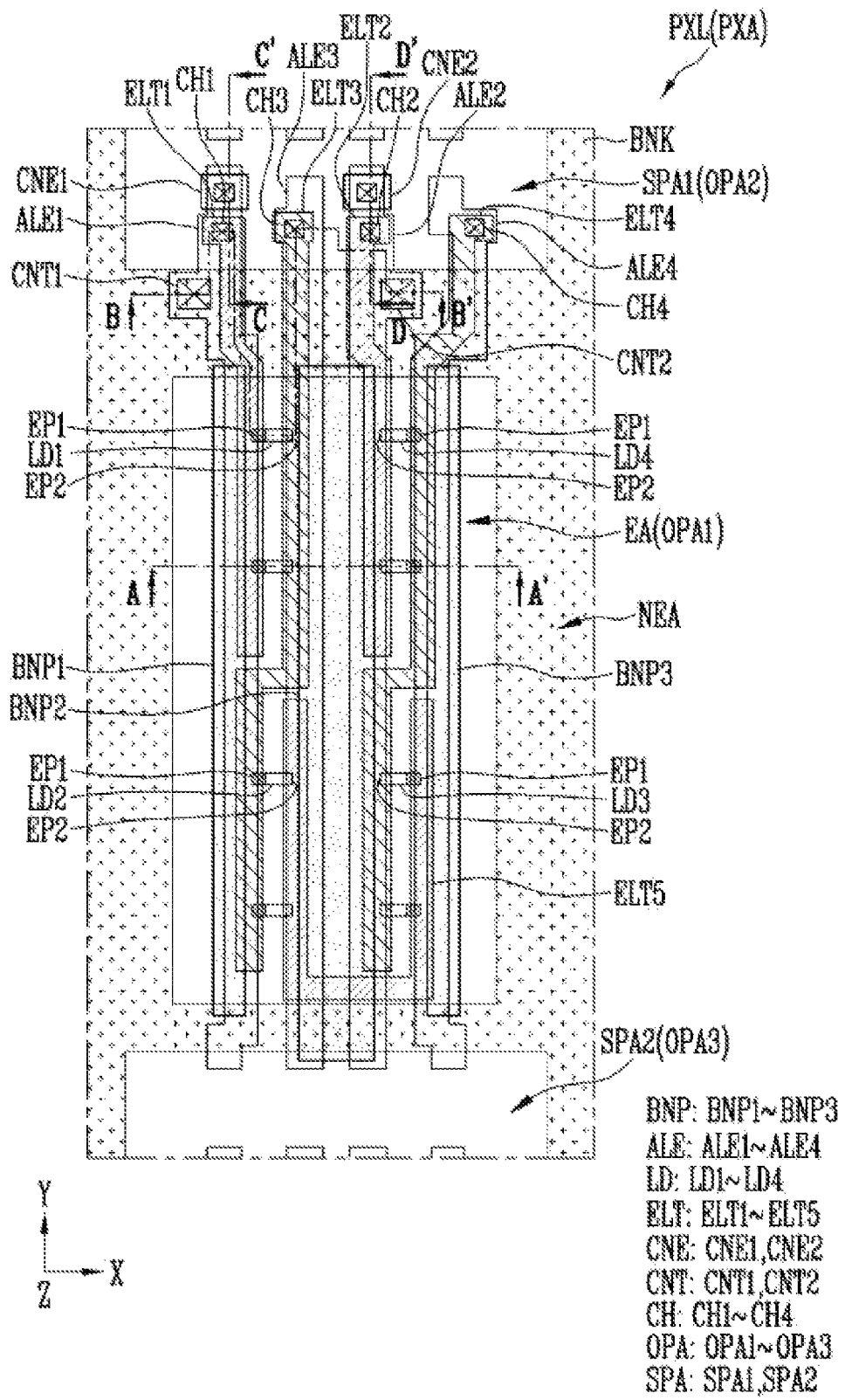
FIG. 5 illustrates a schematic top plan view of a pixel according to an embodiment.
Figure 6:
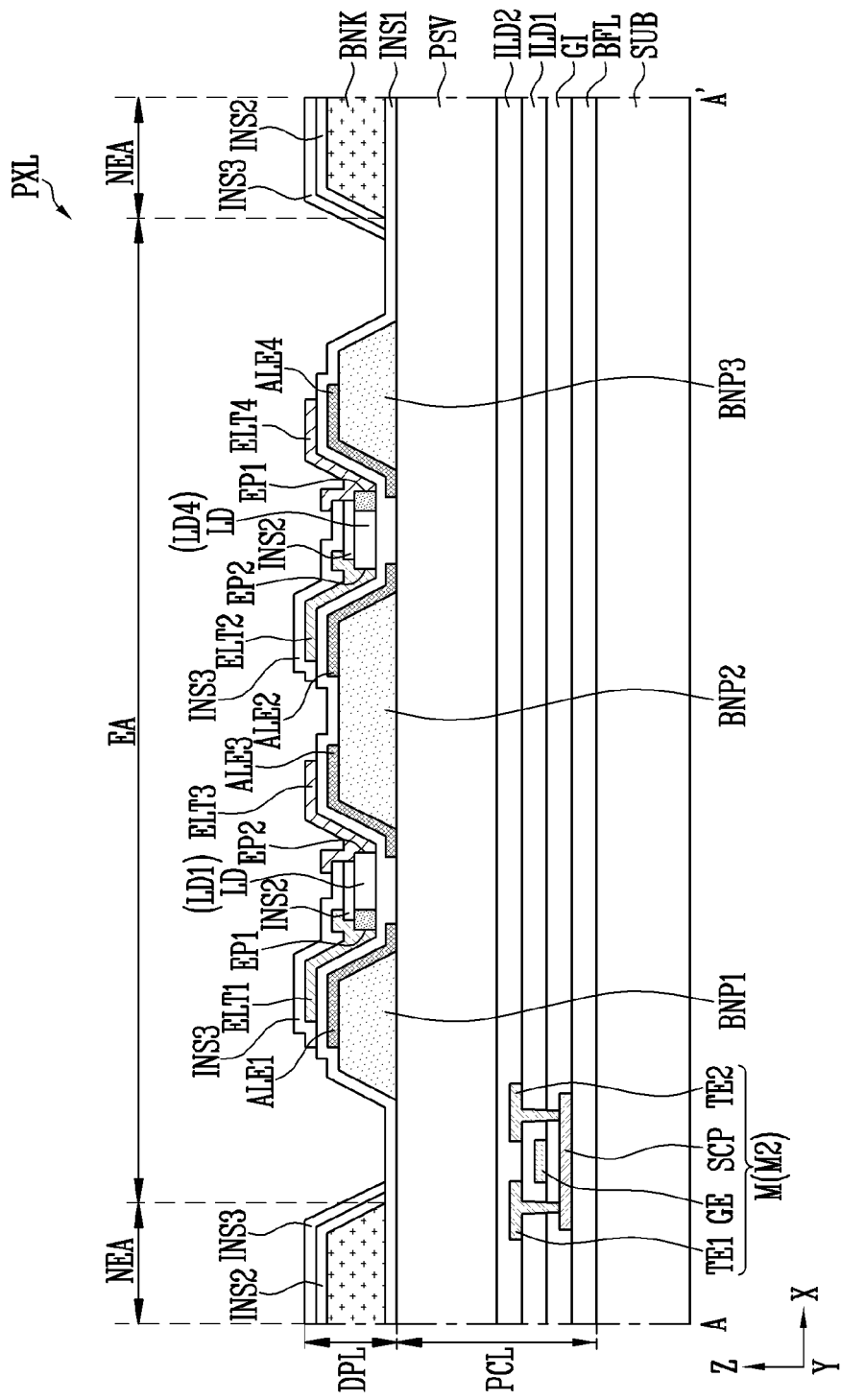
FIG. 6 and FIG. 7 illustrate schematic cross-sectional views taken along line A-N of FIG. 5.
Figure 7:
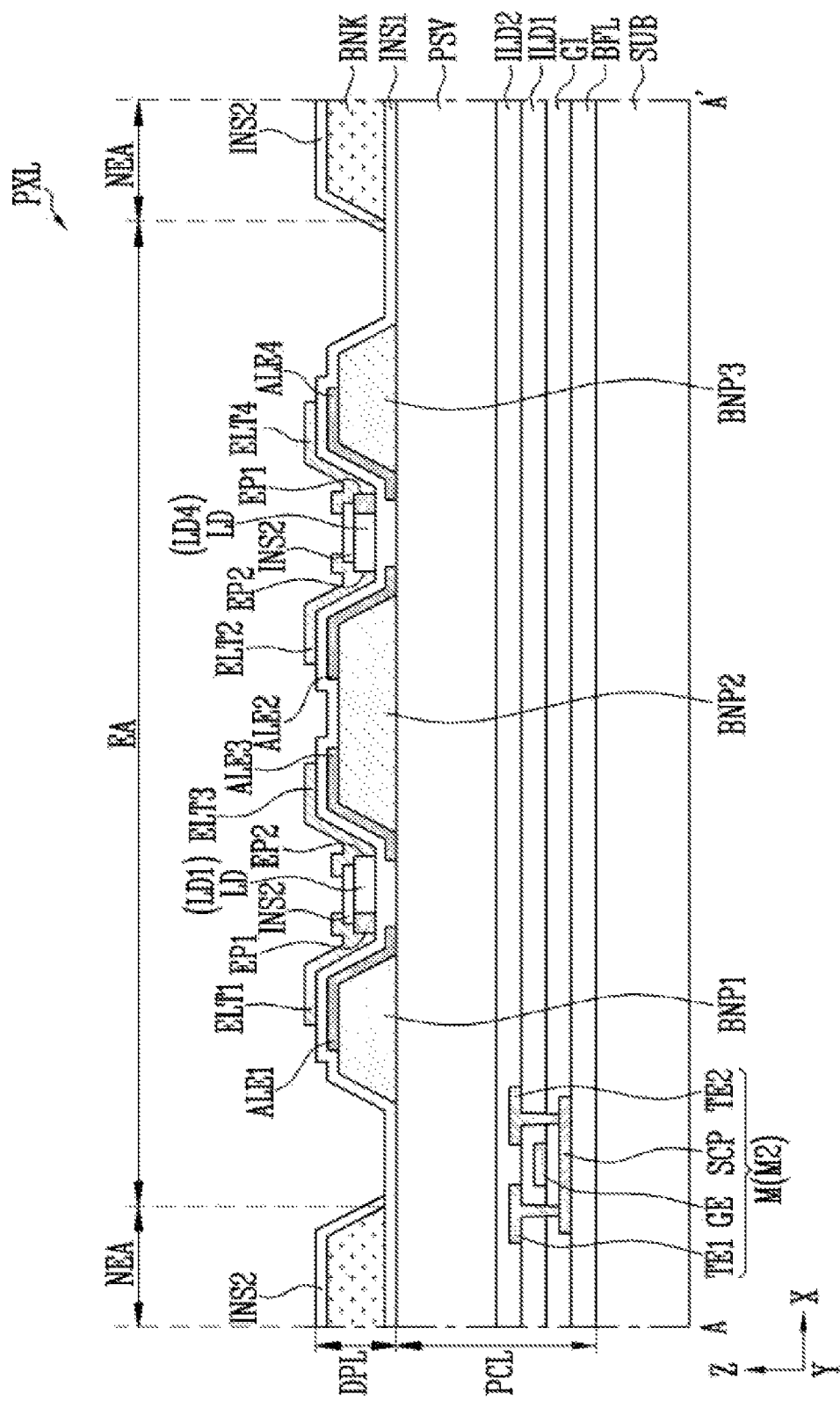
Figure 8:
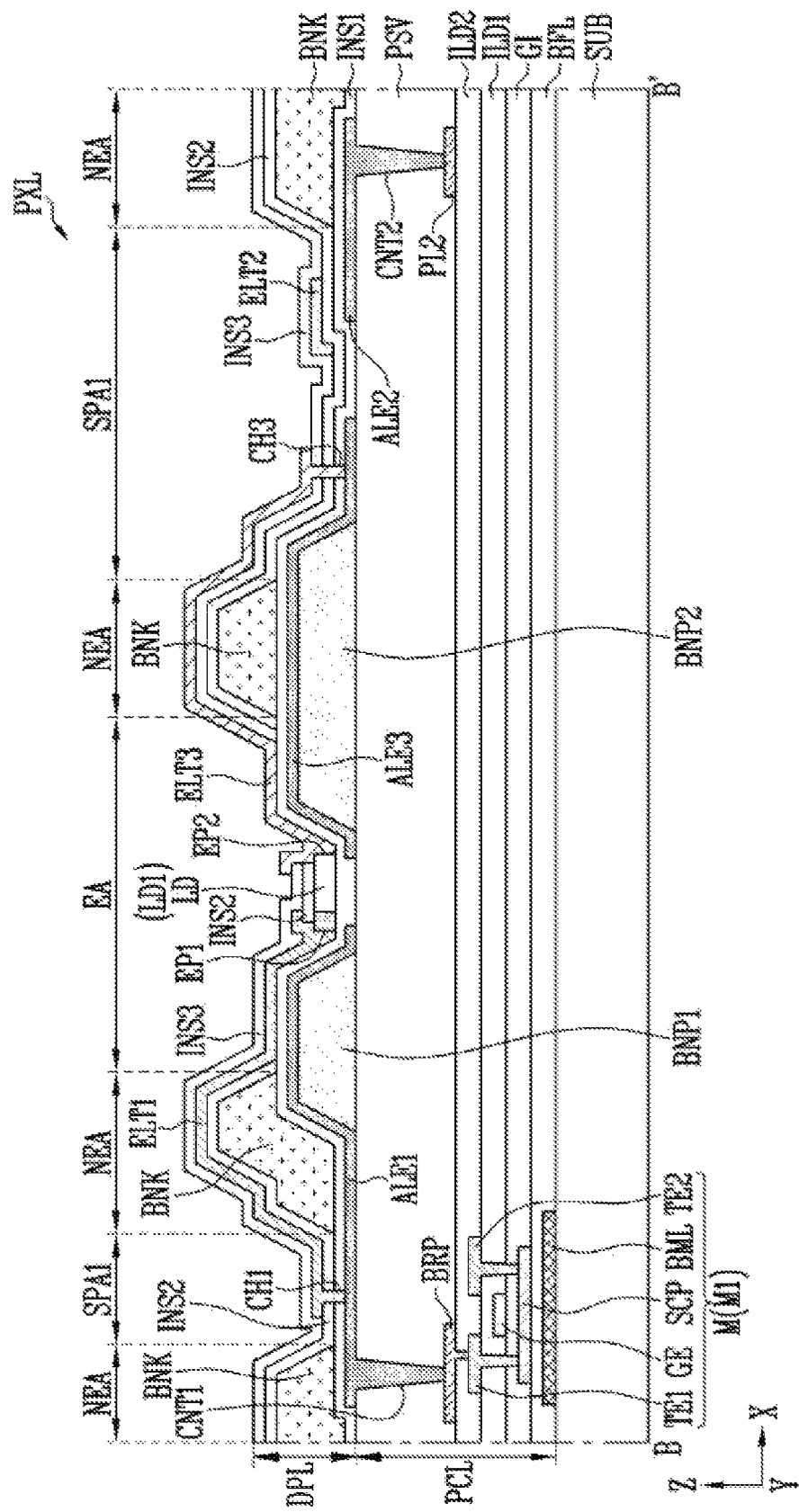
FIG. 8 illustrates a schematic cross-sectional view taken along line B-B' of FIG. 5.
Figure 9:
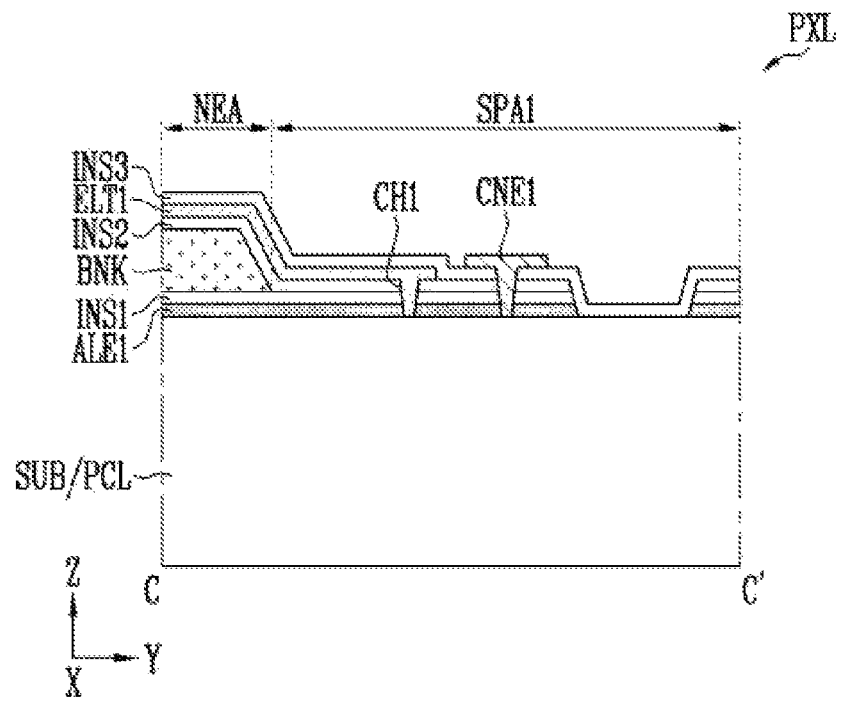
FIG. 9 and FIG. 10 illustrate schematic cross-sectional views taken along line C-C' of FIG. 5.
Figure 10:
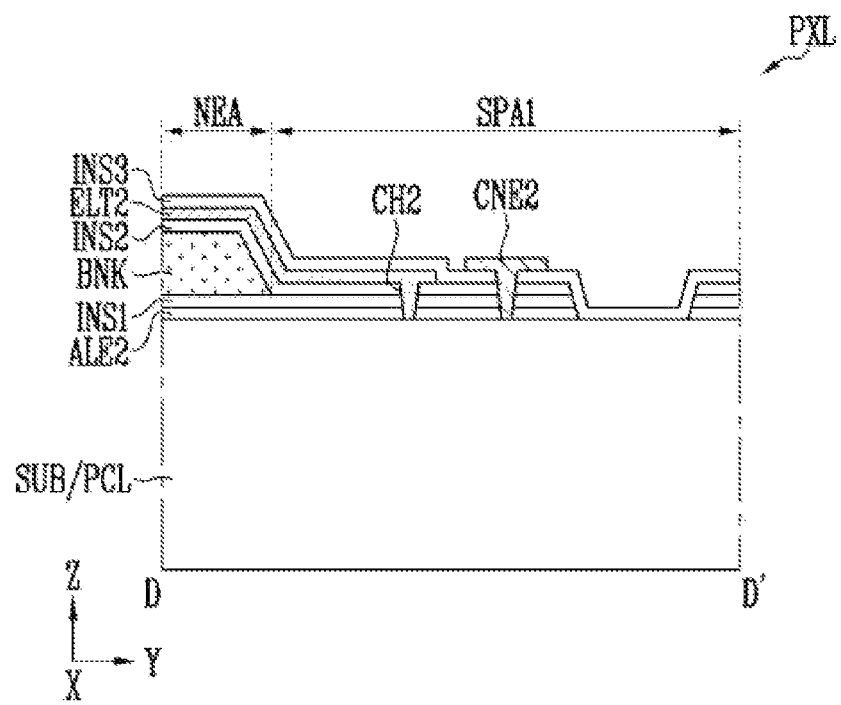
Figure 11:
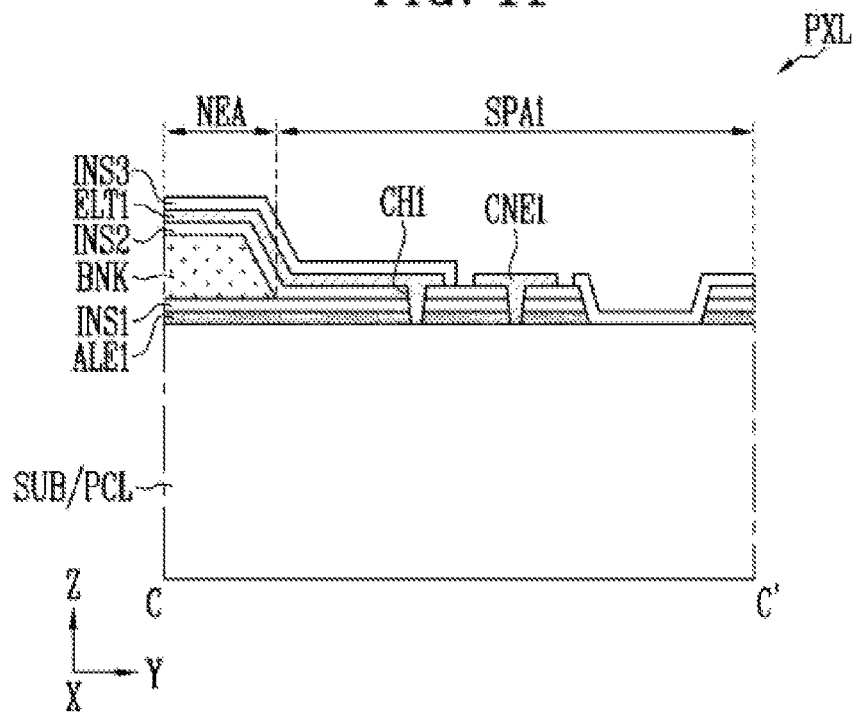
FIG. 11 and FIG. 12 illustrate schematic cross-sectional views taken along line D-D' of FIG. 5.
Figure 12:
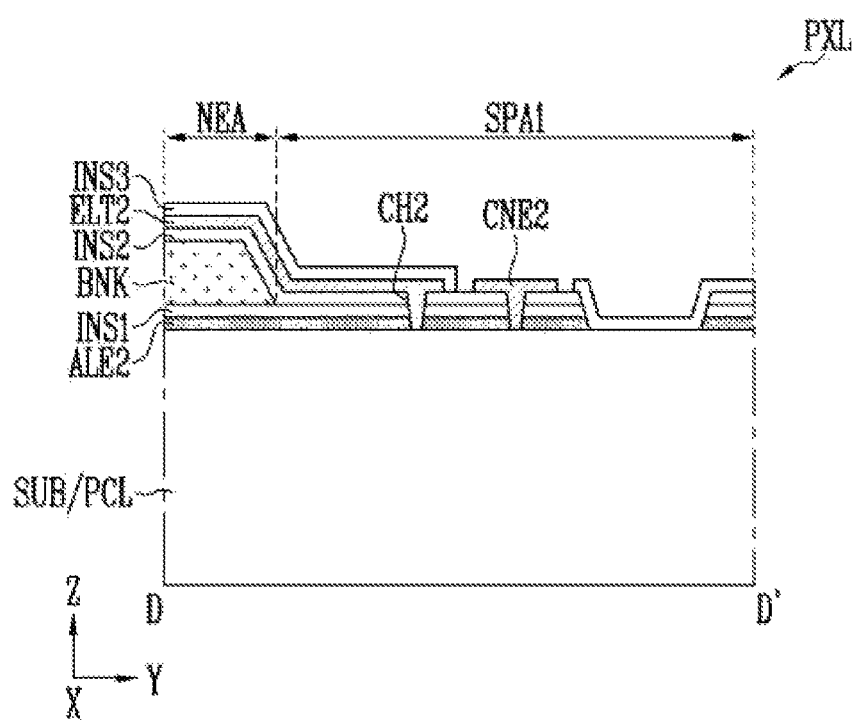

FIG. 5 illustrates a schematic top plan view of a pixel according to an embodiment. FIG. 6 and FIG. 7 illustrate schematic cross-sectional views taken along line A-N of FIG. 5. FIG. 8 illustrates a schematic cross-sectional view taken along line B-B' of FIG. 5. FIG. 9 and FIG. 10 illustrate schematic cross-sectional views taken along line C-C' of FIG. 5. FIG. 11 and FIG. 12 illustrate schematic cross-sectional views taken along line D-D' of FIG. 5.

As an example, FIG. 5 may be one of the first to third pixels PXL1, PXL2, and PXL3 forming the pixel unit PXU of FIG. 3, and the first to third pixels PXL1, PXL2, and PXL3 may be substantially the same or similar to each other. FIG. 5 illustrates the embodiment in which each pixel PXL may include the light emitting elements LD disposed in the four serial stages as shown in FIG. 4, but the number of serial stages of each pixel PXL may be variously changed according to embodiments.

Hereinafter, in case that arbitrarily referring to one or more light emitting element among first to fourth light emitting elements LD1 to LD4, or comprehensively referring to two or more light emitting elements, it or they will be referred to as a "light emitting element LD" or "light emitting elements LD" will be referred. In case that arbitrarily referring to at least one of alignment electrodes including first to fourth alignment electrodes ALE1, ALE2, ALE3, and ALE4, it or they will be referred to as an "alignment electrode ALE" or "alignment electrodes ALE", and in case that arbitrarily referring to at least one of electrodes including first to fifth electrodes ELT1 to ELT5, it or they will be referred to as an "electrode ELT" or "electrodes ELT".

Referring to FIG. 5, each pixel PXL may include a light emitting area EA, a non-light emitting area NEA, and a separation area SPA. The light emitting area EA may be an area that may emit light by including the light emitting elements LD. The non-light emitting area NEA may be disposed to surround the light emitting area EA. The non-light emitting area NEA may be an area in which a bank BNK surrounding the light emitting area EA is provided or disposed. The separation area SPA may be spaced apart from the light emitting area EA with the non-light emitting area NEA interposed therebetween. The separation area SPA may include a first separation area SPA1 disposed at one side or a side of the light emitting area EA, and a second separation area SPA2 disposed at the other side or another side of the light emitting area EA. The separation area SPA may be an area of the remaining pixel areas PXA excluding the light emitting area EA, which is disposed in an opening OPA of the bank BNK and in which at least one alignment electrode ALE is separated or cut (disconnected).

Each pixel PXL may include patterns BNP, alignment electrodes ALE, light emitting elements LD, electrodes ELT, and contact electrodes CNE. For example, each of the pixels PXL may include first to fifth electrodes ELT1 to ELT5, first to fourth light emitting elements LD1 to LD4 electrically connected between the first to fifth electrodes ELT1 to ELT5, first to fourth alignment electrodes ALE1 to ALE4 disposed under or below the first to fifth electrodes ELT1 to ELT5 to overlap at least one electrode ELT, first and second contact electrodes CNE1 and CNE2 electrically connected to at least one of the first to fourth alignment electrodes ALE1 to ALE4, and first to third patterns BNP1 to BNP3 provided or disposed under or below the first to fourth alignment electrodes ALE1 to ALE4 to partially overlap at least one alignment electrode ALE, respectively.

The patterns BNP may be provided or disposed in at least light emitting area EA. The patterns BNP may extend along a second direction (Y-axis direction), and may be spaced apart from each other along a first direction (X-axis direction).

The patterns BNP (also referred to as "wall patterns" or "bank patterns") may partially overlap at least one alignment electrode (ALE) in at least light emitting area EA, respectively. For example, the first pattern BNP1 may be provided or disposed under or below the first alignment electrode ALE1 so as to overlap one area or an area of the first alignment electrode ALE1, the second pattern BNP2 may be provided under or below the second and third alignment electrodes ALE2 and ALE3 so as to overlap one area or an area of each of the second and third alignment electrodes ALE2 and ALE3, and the third pattern BNP3 may be provided or disposed under or below the fourth alignment electrode ALE4 so as to overlap one area or an area of the fourth alignment electrode ALE4.

As the patterns BNP are provided or disposed under or below one area or an area of each of the alignment electrodes ALE, one area or an area of each of the alignment electrodes ALE in areas in which the patterns BNP are formed or disposed may protrude in an upper direction of the pixel PXL, for example, a third direction (Z-axis direction). In case that the patterns BNP and/or alignment electrodes ALE include a reflective material, a reflective wall structure may be formed around the light emitting elements LD. Accordingly, as light emitted from the light emitting elements LD may be directed in an upper direction (for example, a front direction of the display panel PNL including a viewing angle range) of the pixel PXL, light emission efficiency of the pixel PXL may be improved.

The alignment electrodes ALE may be provided or disposed in at least light emitting area EA. The alignment electrodes ALE may extend along a second direction (Y-axis direction), and may be spaced apart from each other along a first direction (X-axis direction). The alignment electrodes ALE may extend from the light emitting area EA through the non-light emitting area NEA to the separation area SPA, and may be separated or cut off in the separation area SPA. For example, each of the first to fourth alignment electrodes ALE1 to ALE4 extends from the light emitting area EA to the first and second separation areas SPA1 and SPA2, and is cut off in the first and second separation areas SPA1 and SPA2, so that it may be separated from the alignment electrodes ALE of the adjacent pixel PXL. However, the disclosure is not limited thereto, and at least one of the alignment electrodes ALE may not be cut off in the separation area SPA, and may be integral with one of the alignment electrodes ALE of the adjacent pixel PXL.

Some or a part of the alignment electrodes ALE may be electrically connected to the pixel circuit PXC and/or a power line through a contact portion CNT. For example, the first alignment electrode ALE1 may be electrically connected to the pixel circuit PXC and/or the first power line PL1 through a first contact portion CNT1, and the second alignment electrode ALE2 may be electrically connected to the second power line PL2 through a second contact portion CNT2. The contact portion CNT may be provided or disposed in the non-light emitting area NEA, but is not limited thereto.

In an embodiment, at least one of the alignment electrodes ALE may be electrically connected to at least one of the electrodes ELT through a contact hole CH, respectively. For example, the first alignment electrode ALE1 may be electrically connected to the first electrode ELT1 through a first contact hole CH1, and the second alignment electrode ALE2 may be electrically connected to the second electrode ELT2 through a second contact hole CH2. The third alignment electrode ALE3 may be electrically connected to the third electrode ELT3 through a third contact hole CH3, and the fourth alignment electrode ALE4 may be electrically connected to the fourth electrode ELT4 through a fourth contact hole CH4. The contact holes CH may be provided or disposed in the separation area SPA, but are not limited thereto.

Each of the alignment electrodes ALE may be disposed on at least one pattern BNP. For example, the first alignment electrode ALE1 may be disposed in one area of the first pattern BNP1, the second and third alignment electrodes ALE2 and ALE3 may be disposed in different areas of the second pattern BNP2, and the fourth alignment electrode ALE4 may be disposed in one area of the third pattern BNP3. In the embodiment, in case that the third alignment electrode ALE3 is disposed between the first and second alignment electrodes ALE1 and ALE2, the third alignment electrode ALE3 may be disposed at one (or left) area of the second pattern BNP2, and the second alignment electrode ALE2 may be disposed at the other (or right) area of the second pattern BNP2.

A pair of alignment electrodes ALE adjacent to each other may receive different signals in an alignment step of the light emitting elements LD. For example, in case that the first alignment electrode ALE1, the third alignment electrode ALE3, the second alignment electrode ALE2, and the fourth alignment electrode ALE4 are sequentially arranged or disposed along the first direction (X-axis direction) in the light emitting area EA, the first and third alignment electrodes ALE1 and ALE3 may form a pair to receive different alignment signals, and the second and fourth alignment electrodes ALE2 and ALE4 may form a pair to receive different alignment signals.

In the embodiment, the second and third alignment electrodes ALE2 and ALE3 may receive a same signal in the alignment step of the light emitting elements LD. The second and third alignment electrodes ALE2 and ALE3 may be integral or non-integral to each other in the alignment step of the light emitting elements LD, but are not limited thereto.

Each of the light emitting elements LD may be aligned between a pair of patterns BNP in the light emitting area EA. Each of the light emitting elements LD may be electrically connected between a pair of electrodes ELT.

The first light emitting element LD1 may be aligned between the first and second patterns BNP1 and BNP2. The first light emitting element LD1 may be electrically connected between the first and third electrodes ELT1 and ELT3. As an example, the first light emitting element LD1 may be aligned at one side or a side (or an upper end) of an area between the first and second patterns BNP1 and BNP2, and the first end portion EP1 of the first light emitting element LD1 may electrically connected to the first electrode ELT1, and the second end portion EP2 of the first light emitting element LD1 may be electrically connected to the third electrode ELT3.

The second light emitting element LD2 may be aligned between the first and second patterns BNP1 and BNP2. The second light emitting element LD2 may be electrically connected between the third and fourth electrodes ELT3 and ELT4. As an example, the second light emitting element LD2 may be aligned at the other side (or a lower end) of an area between the first and second patterns BNP1 and BNP2, and the first end portion EP1 of the second light emitting element LD2 may electrically connected to the third electrode ELT3, and the second end portion EP2 of the second light emitting element LD2 may be electrically connected to the fifth electrode ELT5.

The third light emitting element LD3 may be aligned between the second and third patterns BNP2 and BNP3. The third light emitting element LD3 may be electrically connected between the fourth and fifth electrodes ELT4 and ELT5. As an example, the third light emitting element LD3 may be aligned at the other side (or a lower end) of an area between the second and third patterns BNP2 and BNP3, and the first end portion EP1 of the third light emitting element LD3 may electrically connected to the fifth electrode ELT5, and the second end portion EP2 of the third light emitting eleme6nt LD3 may be electrically connected to the fourth electrode ELT4.

The fourth light emitting element LD4 may be aligned between the second and third patterns BNP2 and BNP3. The fourth light emitting element LD4 may be electrically connected between the second and fourth electrodes ELT2 and ELT4. As an example, the fourth light emitting element LD4 may be aligned at one side or a side (or an upper end) of an area between the second and third patterns BNP2 and BNP3, and the first end portion EP1 of the fourth light emitting element LD4 may electrically connected to the fourth electrode ELT4, and the second end portion EP2 of the fourth light emitting element LD4 may be electrically connected to the second electrode ELT2.

For example, the first light emitting element LD1 may be disposed in an upper left area of the light emitting area EA, and the second light emitting element LD2 may be disposed in a lower left area of the light emitting area EA. The third light emitting element LD3 may be disposed in a lower right area of the light emitting area EA, and the fourth light emitting element LD4 may be disposed in an upper right area of the light emitting area EA. However, the arrangement and/or connection structure of the light emitting elements LD may be variously changed depending on the structure of the light emitting part EMU and/or the number of serial stages.

Each of the electrodes ELT may be at least provided or disposed in the light emitting area EA, and may be disposed to overlap at least one alignment electrode ALE and/or at least one light emitting element LD. For example, each of the electrodes ELT may be formed on the alignment electrodes ALE and/or the light emitting elements LD so as to overlap the alignment electrodes ALE and/or the light emitting elements LD to be electrically connected to the light emitting elements LD.

The first electrode ELT1 may be disposed on the first area (for example, the upper area) of the first alignment electrode ALE1 and the first end portions EP1 of the first light emitting elements LD1 to be electrically connected to the first end portions EP1 of the first light emitting elements LD1.

The second electrode ELT2 may be disposed on the first area (for example, the upper area) of the second alignment electrode ALE2 and the second end portions EP2 of the fourth light emitting elements LD4 to be electrically connected to the second end portions EP2 of the fourth light emitting elements LD4. The second electrode ELT2 may be electrically connected to the first, second, and third light emitting elements LD1, LD2, and LD3 via at least one other electrode ELT and/or light emitting element LD. For example, the second electrode ELT2 may be electrically connected to the second end portions EP2 of the first light emitting elements LD1 via the third electrode ELT3, the second light emitting element LD2, the fifth electrode ELT5, the third light emitting element LD3, the fourth electrode ELT4, and the fourth light emitting element LD4.

The third electrode ELT3 may be disposed on the first area (for example, the upper area) of the third alignment electrode ALE3 and the second end portions EP2 of the first light emitting elements LD1 to be electrically connected to the second end portions EP2 of the first light emitting elements LD1. The third electrode ELT3 may be disposed on the second area (for example, the lower area) of the first alignment electrode ALE1 and the first end portions EP1 of the second light emitting elements LD2 to be electrically connected to the first end portions EP1 of the second light emitting elements LD2. For example, the third electrode ELT3 may electrically connect the second end portions EP2 of the first light emitting elements LD1 and the first end portions EP1 of the second light emitting elements LD2 in the light emitting area EA. For this, the third electrode ELT3 may have a substantially curved shape. For example, the third electrode ELT3 may have a substantially curved or substantially bent structure at a boundary between an area in which at least one first light emitting element LD1 is arranged or disposed and an area in which at least one second light emitting element LD2 is arranged or disposed.

The third electrode ELT3 may be disposed between the first and second electrodes ELT1 and ELT2, and may be electrically connected between the first and second electrodes ELT1 and ELT2 through the light emitting elements LD. For example, the third electrode ELT3 may be electrically connected to the first electrode ELT1 through at least one first light emitting element LD1, and may be electrically connected to the second electrode ELT2 through at least one of the second, third, and/or fourth light emitting elements LD2, LD3, and/or LD4.

The fourth electrode ELT4 may be disposed on the second area (for example, the lower area) of the second alignment electrode ALE2 and the second end portions EP2 of the third light emitting elements LD3 to be electrically connected to the second end portions EP2 of the third light emitting elements LD3. The fourth electrode ELT4 may be disposed on the second area (for example, the upper area) of the fourth alignment electrode ALE4 and the first end portions EP1 of the fourth light emitting elements LD4 to be electrically connected to the first end portions EP1 of the fourth light emitting elements LD4. For example, the fourth electrode ELT4 may electrically connect the second end portions EP2 of the third light emitting elements LD3 and the first end portions EP1 of the fourth light emitting elements LD4 in the light emitting area EA. For this, the fourth electrode ELT4 may have a substantially curved shape. For example, the fourth electrode ELT4 may have a curved or bent structure at a boundary between an area in which at least one third light emitting element LD3 is arranged or disposed and an area in which at least one fourth light emitting element LD4 is arranged or disposed.

The fourth electrode ELT4 may be electrically connected between the first and second electrodes ELT1 and ELT2 through the light emitting elements LD. For example, the fourth pixel electrode ELT4 may be electrically connected to the first electrode ELT1 through at least one of the first, second, and/or third light emitting elements LD1, LD2, and LD3, and may be electrically connected to the second electrode ELT2 through at least one fourth light emitting element LD4.

The fifth pixel electrode ELT5 may be disposed on the second area (for example, the lower area) of the third alignment electrode ALE3 and the second end portions EP2 of the second light emitting elements LD2 to be electrically connected to the second end portions EP2 of the second light emitting elements LD2. The fifth pixel electrode ELT5 may be disposed on the first area (for example, the lower area) of the fourth alignment electrode ALE4 and the first end portions EP1 of the third light emitting elements LD3 to be electrically connected to the first end portions EP1 of the third light emitting elements LD3. For example, the fifth electrode ELT5 may electrically connect the second end portions EP2 of the second light emitting elements LD2 and the first end portions EP1 of the third light emitting elements LD3 in the light emitting area EA. For this, the fifth electrode ELT5 may have a substantially curved shape. For example, the fifth electrode ELT5 may have a curved or bent structure at or around a boundary between an area in which at least one second light emitting element LD2 is arranged or disposed and an area in which at least one third light emitting element LD3 is arranged or disposed. In the embodiment, the fifth electrode ELT5 does not extend to the separation area SPA and may be formed only inside the light emitting area EA, but is not limited necessarily thereto.

The fifth electrode ELT5 may be electrically connected between the first and second electrodes ELT1 and ELT2 through the light emitting elements LD. For example, the fifth electrode ELT5 may be electrically connected to the first electrode ELT1 through at least one of the first and second light emitting elements LD1 and LD2, and may be electrically connected to the second electrode ELT2 through at least one of the third and/or fourth light emitting elements LD3 and/or LD4.

In the embodiment, each of the electrodes ELT may extend from the light emitting area EA through the non-light emitting area NEA to the separation area SPA, and may be electrically connected to at least one alignment electrode ALE through each contact hole CH in the separation area SPA. For example, the first to fourth electrodes ELT1 to ELT4 may extend from the light emitting area EA to the first separation area SPA1. In the first separation area SPA1, the first electrode ELT1 may be electrically connected to the first alignment electrode ALE1 through the first contact hole CH1, and the second electrode ELT2 may be electrically connected to the second alignment electrode ALE2 through the second contact hole CH2. In the first separation area SPA1, the third electrode ELT3 may be electrically connected to the third alignment electrode ALE3 through the third contact hole CH3, and the fourth electrode ELT4 may be electrically connected to the fourth alignment electrode ALE4 through the fourth contact hole CH4.

FIG. 5 illustrates the embodiment in which all of the first to fourth electrodes ELT1 to ELT4 extend to the first separation area SPA1, but the disclosure is not limited thereto. For example, some or a part or all of the first to fourth electrodes ELT1 to ELT4 may extend to the second separation area SPA2 to be electrically connected to each alignment electrode ALE in the second separation area SPA2.

As such, in case that the contact holes CH are disposed in the separation area SPA, the contact holes CH may be formed in an area excluding the light emitting area EA in which the light emitting elements LD are supplied and aligned, so that in the alignment step of the light emitting elements LD, a more uniform electric field may be formed in the light emitting area EA, and separation of the light-emitting elements LD may be prevented.

According to the above-described manner, the light emitting elements LD arranged or disposed between the alignment electrodes ALE and/or the patterns BNP overlapping the electrodes ELT may be electrically connected in a desired shape by using the electrodes ELT. For example, the first light emitting elements LD1, the second light emitting elements LD2, the third light emitting elements LD3, and the fourth light emitting elements LD4 may be sequentially electrically connected in series by using the electrodes ELT.

The contact electrodes CNE may be disposed in the separation area SPA. The contact electrodes CNE may be electrically connected to at least one of the alignment electrodes ALE, and the resistance of each pixel PXL may be measured through the contact electrodes CNE. For example, the reliability of the display panel PNL may be improved by detecting a change in resistance in each pixel PXL through the contact electrodes CNE to detect a disconnection or short circuit defect. As described above, in case that the resistances of respective pixels PXL are measured by using contact electrodes CNE, the change in resistance may be detected without contacting or directly contacting the alignment electrodes ALE and/or the electrodes ELT, so that in the process of measuring the resistance of the pixel PXL, it is possible to prevent the alignment electrodes ALE and/or the electrodes ELT from being damaged. By disposing the contact electrodes CNE in the separation area SPA, an additional space for forming the contact electrodes CNE is unnecessary, so that a high resolution display device may be readily implemented.

The first contact electrode CNE1 may be disposed to overlap the first alignment electrode ALE1 in the first separation area SPA1. The first contact electrode CNE1 may be electrically connected to the first alignment electrode ALE1 through a contact hole through an insulation layer disposed between the first contact electrode CNE1 and the first alignment electrode ALE1. The first contact electrode CNE1 may be disposed to non-overlap the first electrode ELT1 described above. For example, the first contact electrode CNE1 may be spaced apart from the first electrode ELT1 in the second direction (Y-axis direction), but is not limited thereto.

The second contact electrode CNE2 may be disposed to overlap the second alignment electrode ALE1 in the first separation area SPA1. The second contact electrode CNE2 may be electrically connected to the second alignment electrode ALE2 through a contact hole through an insulation layer disposed between the second contact electrode CNE2 and the second alignment electrode ALE2. The second contact electrode CNE2 may be disposed to non-overlap the second electrode ELT2 described above. For example, the second contact electrode CNE2 may be spaced apart from the second electrode ELT2 in the second direction (Y-axis direction), but is not limited thereto.

FIG. 5 illustrates the case in which the first and second contact electrodes CNE1 and CNE2 are disposed in the first separation area SPA1, but the disclosure is not limited thereto. In an embodiment, some or a part or all of the first and second contact electrodes CNE1 and CNE2 may be electrically connected to the first and second alignment electrodes ALE1 and ALE2, respectively, in the second separation area SPA2.

The bank BNK may be provided or disposed in the non-light emitting area NEA to surround the light emitting area EA and the separation area SPA. The bank BNK may be provided or disposed at an outer portion of each pixel area PXA and/or between adjacent pixel areas PXA so as to include openings OPA corresponding to the light emitting area EA and the separation area SPA of the pixel PXL. For example, the bank BNK may include a first opening OPA1 corresponding to the light emitting area EA, a second opening OPA2 corresponding to the first separation area SPA1, and a third opening OPA3 corresponding to the second separation area SPA2. For example, the bank BNK may include a first opening OPA1 defining the light emitting area EA, a second opening OPA2 defining the first separation area SPA1, and a third opening OPA3 defining the second separation area SPA2.

The bank BNK may form a dam structure that defines the light emitting area EA in which the light emitting elements LD should be supplied in the step of supplying the light emitting elements LD to each pixel PXL. For example, the light emitting area EA is partitioned by the second bank BNK2, so that a desired type and/or amount of light emitting element ink may be supplied into the light emitting area EA.

The bank BNK may include at least one light blocking and/or reflective material. Accordingly, light leakage between adjacent pixels PXL may be prevented. For example, the bank BNK may include at least one of a black matrix material and/or a color filter material. For example, the bank BNK may be formed in a black opaque pattern that may block transmission of light. In the embodiment, a reflective film (not shown) may be formed on a surface (for example, a side wall) of the bank BNK to increase the light efficiency of each pixel PXL.

Hereinafter, a cross-sectional structure of each pixel PXL will be described in detail with reference to FIG. 6 to FIG. 12, based on the light emitting element LD. FIG. 6 and FIG. 7 illustrate the second transistor M2 among various circuit elements forming the pixel circuit PXC, and FIG. 8 illustrates the first transistor M1. Hereinafter, in case that it is not necessary to distinguish and specify the first transistor M1 and the second transistor M2, they will be comprehensively referred to as the "transistor M". Structures of the transistors M and/or a position of each layer thereof are not limited to the embodiments shown in FIG. 6 to FIG. 8, and may be variously changed according to embodiments.

Referring to FIG. 6 to FIG. 12, the pixels PXL according to the embodiment and the display panel PNL including the pixels PXL may include a circuit layer PCL and a display layer DPL that are disposed on one surface of a substrate SUB.

Circuit elements (for example, the transistors M and the storage capacitor Cst) forming the pixel circuit PXC of the corresponding pixel PXL and various wires electrically connected to the circuit elements may be disposed in the circuit layer PCL. The alignment electrodes ALE, the light emitting elements LD, and/or the electrodes ELT that form the light emitting part EMU of the corresponding pixel PXL may be disposed in the display layer DPL.

By way of example, the substrate SUB forms a base member, and may be a rigid or flexible substrate or film. For example, the substrate SUB may be a hard substrate made of glass or tempered glass, a flexible substrate (or a thin film) made of a plastic or metallic material, or at least one layered insulation layer. The material and/or physical properties of the substrate SUB are not particularly limited. In the embodiment, the substrate SUB may be substantially transparent. Here, "substantially transparent" may mean that light may be transmitted at a transmittance or more. In an embodiment, the substrate SUB may be translucent or opaque. The substrate SUB may include a reflective material according to an embodiment.

The transistor M may be disposed on the substrate SUB. The transistor M may include a semiconductor pattern SCP, a gate electrode GE, and first and second transistor electrodes TE1 and TE2, and may selectively further include a bottom metal layer BML.

The bottom metal layer BML may be disposed on the substrate SUB. The bottom metal layer BML may overlap the gate electrode GE and/or the semiconductor pattern SCP of at least one transistor M (for example, the first transistor M1).

A buffer layer BFL may be disposed on the bottom metal layer BML. The buffer layer BFL may prevent impurities from diffusing into each circuit element. The buffer layer BFL may be formed as a single layer, but may also be formed as a multilayer of at least two layers or more. In case that the buffer layer BFL is formed as the multilayer, respective layers may be made of the same material or similar material or different materials.

The semiconductor pattern SCP may be disposed on the buffer layer BFL. For example, the semiconductor pattern SCP may include a first area contacting the first transistor electrode TE1, a second area contacting the second transistor electrode TE2, and a channel area disposed between the first and second areas. In an embodiment, one of the first and second areas may be a source area, and the other thereof may be a drain area.

In an embodiment, the semiconductor pattern SCP may be made of polysilicon, amorphous silicon, an oxide semiconductor, or the like within the spirit and the scope of the disclosure. The channel area of the semiconductor pattern SCP may be an intrinsic semiconductor as a semiconductor pattern that is not doped with impurities, and each of the first and second areas of the semiconductor pattern SCP may be a semiconductor doped with impurities.

A gate insulation layer GI may be disposed on the semiconductor pattern SCP. For example, the gate insulation layer GI may be disposed between the semiconductor pattern SCP and the gate electrode GE. The gate insulation layer GI may be formed as a single layer or multilayer, and may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

The gate electrode GE may be disposed on the gate insulation layer GI. The gate electrode GE may be disposed to overlap the semiconductor pattern SCP in the third direction (Z-axis direction) on the gate insulation layer GI.

A first interlayer insulation layer ILD1 may be disposed on the gate electrode GE. For example, the first interlayer insulation layer ILD1 may be disposed between the gate electrode GE and the first and second transistor electrodes TE1 and TE2. The first interlayer insulation layer ILD1 may be formed as a single layer or multilayer, and may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

The first and second transistor electrodes TE1 and TE2 may be disposed on the first interlayer insulation layer ILD1. The first and second transistor electrodes TE1 and TE2 may be disposed to overlap the semiconductor pattern SCP in the third direction (Z-axis direction). The first and second transistor electrodes TE1 and TE2 may be electrically connected to the semiconductor pattern SCP. For example, the first transistor electrode TE1 may be electrically connected to a first area of the semiconductor pattern SCP through a contact hole penetrating the first interlayer insulation layer ILD1 and the gate insulation layer GI. The second transistor electrode TE2 may be electrically connected to a second area of the semiconductor pattern SCP through a contact hole penetrating the first interlayer insulation layer ILD1 and the gate insulation layer GI. In an embodiment, one of the first and second transistor electrodes TE1 and TE2 may be a source electrode, and the other thereof may be a drain electrode.

A second interlayer insulation layer ILD2 may be disposed on the first and second electrodes TE1 and TE2. The second interlayer insulation layer ILD2 may be formed as a single layer or multilayer, and may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

A bridge pattern BRP and/or the second power line PL2 may be disposed on the second interlayer insulation layer ILD2. The bridge pattern BRP may be electrically connected to the first transistor electrode TE1 through a contact hole penetrating the second interlayer insulation layer ILD2. The bridge pattern BRP and the second power line PL2 may be formed of a same conductive layer. For example, the bridge pattern BRP and the second power line PL2 may be simultaneously formed in the same process, but are not limited thereto.

The passivation layer PSV may be disposed on circuit elements including the transistors M. The passivation layer PSV may be made of an organic material in order to flatten a lower step thereof. For example, the passivation layer PSV may include an organic material such as an acrylates resin, an epoxy resin, a phenolic resin, a polyamides resin, a polyimides resin, a polyesters resin, a polyphenylenesulfides resin, or a benzocyclobutene (BCB). However, it is not necessarily limited thereto, and the passivation layer PSV may be formed as a single layer or multilayer, and may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

The display layer DPL may be disposed on the passivation layer PSV of the circuit layer PCL. The display layer DPL may include the patterns BNP, the alignment electrodes ALE, the light emitting elements LD, and the electrodes ELT.

The patterns BNP may be disposed on the passivation layer PSV. The patterns BNP may have various shapes according to embodiments. In an embodiment, the patterns BNP may have a shape substantially protruding in the third direction (Z-axis direction) on the substrate SUB. The patterns BNP may be formed to have an inclined surface inclined at an angle with respect to the substrate SUB. However, the disclosure is not necessarily limited thereto, and the patterns BNP may have a side wall having a substantially curved surface or a substantially step shape. For example, the patterns BNP may have a cross-section substantially of a semicircle or semi-ellipse shape.

Electrodes and insulation layers disposed at an upper portion of the patterns BNP may have a shape substantially corresponding to the patterns BNP. As an example, the alignment electrodes ALE disposed on the patterns BNP may include an inclined surface or a curved surface having a shape substantially corresponding to the shape of the patterns BNP. Accordingly, the patterns BNP, along with the alignment electrodes ALE provided or disposed thereon, may function as a reflective member that guides the light emitted from the light emitting elements LD in a front direction of the pixel PXL (Z-axis direction) to improve the light emitting efficiency of the display panel PNL.

The patterns BNP may include at least one organic material and/or inorganic material. For example, the patterns BNP may include an organic material such as an acrylates resin, an epoxy resin, a phenolic resin, a polyamides resin, a polyimides resin, a polyesters resin, a polyphenylenesulfides resin, or a benzocyclobutene (BCB). However, it is not necessarily limited thereto, and the patterns BNP may be formed as a single layer or multilayer, and may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

The alignment electrodes ALE may be disposed on the passivation layer PSV and the patterns BNP. The alignment electrodes ALE may be disposed to be spaced apart from each other in the light emitting area EA. As described above, the alignment electrodes ALE may receive an alignment signal in the alignment step of the light emitting elements LD. Accordingly, an electric field is formed between the alignment electrodes ALE so that the light emitting elements LD supplied to each pixel PXL may be aligned between the alignment electrodes ALE.

In the embodiment, each of the alignment electrodes ALE may have a pattern separated for each pixel PXL, or may have a pattern commonly connected to adjacent pixels PXL. For example, each of the first to fourth alignment electrodes ALE1 to ALE4 may have an independent pattern with both ends cut off in the separation pattern SPA disposed at the outer periphery of the corresponding pixel area PXA. As an example, at least one alignment electrode (for example, the first alignment electrode ALE1) may have an independent pattern of which both ends are cut in the separation area SPA, and at least one other alignment electrode (for example, the second alignment electrode ALE2) may extend in the first direction (X-axis direction) or the second direction (Y-axis direction) to be integral to an electrode of other adjacent pixels PXL (for example, the second alignment electrode ALE2 of the adjacent pixel PXL).

The first alignment electrode ALE1 may be electrically connected to the bridge pattern BRP through the first contact portion CNT1 penetrating the passivation layer PSV, and through this, may be electrically connected to the transistor M. The second alignment electrode ALE2 may be electrically connected to the second power line PL2 through the second contact portion CNT2 penetrating the passivation layer PSV.

Each of the alignment electrodes ALE may include at least one conductive material. For example, each of the alignment electrodes ALE may include at least one metal of various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu), or an alloy including the same; a conductive oxide such as an indium tin oxide (ITO), an indium zinc oxide (IZO), an indium tin zinc Oxide (ITZO), a zinc oxide (ZnO), an aluminum zinc oxide (AZO), a gallium zinc oxide (GZO), a zinc tin oxide (ZTO), a gallium tin oxide (GTO), or a fluorine tin oxide (FTO); and at least one conductive material among conductive polymers such as PEDOT, but are not necessarily limited thereto.

A first insulation layer INS1 may be disposed on the alignment electrodes ALE. The first insulation layer INS1 may be formed as a single layer or multilayer, and may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

The bank BNK may be disposed on the first insulation layer INS1 of the non-light emitting area NEA. For example, the bank BNK may be provided or disposed in the non-light emitting area NEA to surround the light emitting area EA and the separation area SPA.

The bank BNK may be disposed to overlap the first and/or second contact portions CNT1 and CNT2. For example, the bank BNK may be disposed to cover or overlap the first and second contact portions CNT1 and CNT2. However, the disclosure is not necessarily limited thereto, and the bank BNK may be disposed to non-overlap the first and second contact portion CNT1 and CNT2.

In the embodiment, the bank BNK may be disposed to non-overlap the contact holes CH. Accordingly, after the formation of the bank BNK, each of the electrodes ELT and each of the alignment electrodes ALE may be readily connected.

The bank BNK may include at least one organic material and/or inorganic material. For example, the bank BNK may include an organic material such as an acrylates resin, an epoxy resin, a phenolic resin, a polyamides resin, a polyimides resin, a polyesters resin, a polyphenylenesulfides resin, or a benzocyclobutene (BCB). However, it is not necessarily limited thereto, and the bank BNK may be formed as a single layer or multilayer, and may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

The light emitting elements LD may be disposed on the first insulation layer INS1 of the light emitting area EA. The light emitting elements LD may be disposed between the alignment electrodes ALE on the first insulation layer INS1. The light emitting elements LD may be prepared in a form dispersed in a solution, and may be supplied to each pixel PXL through an inkjet printing method and the like within the spirit and the scope of the disclosure. For example, the light emitting elements LD may be dispersed in a volatile solvent to be provided or disposed in the light emitting area of each pixel PXL. In the process of aligning the light emitting elements LD, in case that an alignment signal is supplied through the alignment electrodes ALE, as an electric field is formed between the alignment electrodes ALE, the light emitting elements LD may be aligned between the alignment electrodes ALE. After the light emitting elements LD are aligned, the light emitting elements LD may be stably arranged or disposed between the alignment electrodes ALE by volatilizing the solvent or eliminating it in other ways.

A second insulation layer INS2 may be disposed on the light emitting elements LD. The second insulation layer INS2 may be partially disposed on the light emitting elements LD. In case that the second insulation layer INS2 is formed on the light emitting elements LD after the alignment of the light emitting elements LD is completed, it is possible to prevent the light emitting elements LD from deviating from an aligned position. The second insulation layer INS2 is disposed on the light emitting elements LD, and may expose the first and second end portions EP1 and EP2 of the light emitting elements LD.

The second insulation layer INS2 may be formed as a single layer or multilayer, and may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

The electrodes ELT may be disposed on the first and second end portions EP1 and EP2 of the light emitting elements LD exposed by the second insulation layer INS2. Each of the electrodes ELT may be made of various transparent conductive materials. For example, the electrodes ELT may include at least one of various transparent materials such as an indium tin oxide (ITO), an indium zinc oxide (IZO), an indium tin zinc oxide (ITZO), a zinc oxide (ZnO), an aluminum zinc oxide (AZO), a gallium zinc oxide (GZO), a zinc tin oxide (ZTO), a gallium tin oxide (GTO), or a fluorine tin oxide (FTO), and they may be implemented to be substantially transparent or translucent to satisfy a transmittance. Accordingly, the light emitted from the first and second end portions EP1 and EP2 of the light emitting elements LD may pass through the electrodes ELT to be emitted to the outside of the display panel PNL.

The electrodes ELT may be formed as conductive layers to be disposed on different layers. For example, as shown in FIG. 6, the first and second electrodes ELT1 and ELT2 may be disposed on the second insulation layer INS2, and the third and fourth electrodes ELT3 and ELT4 may be disposed on the first and second electrodes ELT1 and ELT2. The first electrode ELT1 and the second electrode ELT2 may be disposed on a same layer, and the third electrode ELT3 and the fourth electrode ELT4 may be disposed on a same layer. As described above, in case that the electrodes ELT may be formed of conductive layers, an insulation layer may be disposed between the conductive layers. For example, the third insulation layer INS3 may be further disposed between the first and second electrodes ELT1 and ELT2 and the third and fourth electrodes ELT3 and ELT4. The third insulation layer INS3 covers or overlaps the first and second electrodes ELT1 and ELT2, and may expose the second end portion EP2 of the light emitting element LD. The third electrode ELT3 or the fourth electrode ELT4 may be disposed on the second end portion EP2 of the light emitting element LD exposed by the third insulation layer INS3. As described above, in case that the third insulation layer INS3 is disposed between the electrodes ELT made of different conductive layers, since the electrodes ELT may be stably separated by the third insulation layer INS3, it is possible to ensure electrical stability between the first and second end portions EP1 and EP2 of the light emitting elements LD. Accordingly, it is possible to effectively prevent a short circuit defect from occurring between the first and second end portions EP1 and EP2 of the light emitting elements LD.

In an embodiment, the electrodes ELT may be disposed on a same layer as shown in FIG. 7. For example, the electrodes ELT may be formed of a same conductive layer. The electrodes ELT may be formed simultaneously in the same process, but are not limited thereto.

Each of the electrodes ELT may be electrically connected to at least one of the alignment electrodes ALE through the contact holes CH penetrating the insulation layers INS1, INS2, and INS3 disposed therebelow. For example, the first electrode ELT1 may be electrically connected to the first alignment electrode ALE1 through the first contact hole CH1 penetrating the first and second insulation layers INS1 and INS2. The second electrode ELT2 may be electrically connected to the second alignment electrode ALE2 through the second contact hole CH2 penetrating the first and second insulation layers INS1 and INS2. The third electrode ELT3 may be electrically connected to the third alignment electrode ALE3 through the third contact hole CH3 penetrating the first to third insulation layers INS1, INS2, and INS3. The fourth electrode ELT4 may be electrically connected to the fourth alignment electrode ALE4 through the fourth contact hole CH4 penetrating the first and second insulation layers INS1 and INS2.

The contact electrodes CNE may be disposed on the second insulation layer INS2 and/or the third insulation layer INS3 of the separation area SPA.

In the embodiment, the contact electrodes CNE may be disposed on a same layer as the third and fourth electrodes ELT3 and ELT4 described above. For example, as shown in FIG. 9 and FIG. 10, the contact electrodes CNE may be disposed on the third insulation layer INS3. The resistance of each pixel PXL may be measured through the contact electrodes CNE exposed on the third insulation layer INS3. For example, as described above, the reliability of the display panel PNL may be improved by detecting a change in resistance in each pixel PXL through the contact electrodes CNE to detect a disconnection or short circuit defect. As described above, in case that the contact electrodes CNE are formed of a same conductive layer as the third and fourth electrodes ELT3 and ELT4, the contact electrodes CNE may be formed simultaneously in the same process as the third and fourth electrodes ELT3 and ELT4, but are not limited thereto.

In an embodiment, the contact electrodes CNE may be disposed on a same layer as the first and second electrodes ELT1 and ELT2 described above. For example, as shown in FIG. 11 and FIG. 12, the contact electrodes CNE may be disposed on the second insulation layer INS2. The third insulation layer INS3 disposed on the second insulation layer INS2 may include an opening exposing the contact electrodes CNE. Accordingly, as described above, a disconnection or short circuit defect may be detected by measuring the resistance of each pixel PXL through the contact electrodes CNE exposed by the third insulation layer INS3. As described above, in case that the contact electrodes CNE are formed of a same conductive layer as the first and second electrodes ELT1 and ELT2, the contact electrodes CNE may be formed simultaneously in the same process as the first and second electrodes ELT1 and ELT2, but are not limited thereto.

Each of the contact electrodes CNE may be made of various transparent conductive materials. For example, the contact electrodes CNE may include at least one of various transparent materials such as an indium tin oxide (ITO), an indium zinc oxide (IZO), an indium tin zinc oxide (ITZO), a zinc oxide (ZnO), an aluminum zinc oxide (AZO), a gallium zinc oxide (GZO), a zinc tin oxide (ZTO), a gallium tin oxide (GTO), or a fluorine tin oxide (FTO).

According to the above-described embodiment, the reliability of the display panel PNL may be improved by measuring the resistance of each pixel PXL through the contact electrodes CNE disposed in the separation area SPA to detect a disconnection or short circuit defect. Since a change in resistance may be detected without contacting or directly contacting the alignment electrodes ALE, it is possible to prevent the alignment electrodes ALE from being damaged in the process of measuring the resistance of the pixel PXL. By disposing the contact electrodes CNE in the separation area SPA, an additional space for forming the contact electrodes CNE is unnecessary, so that a high resolution display device may be readily implemented.

Hereinafter, an embodiment will be described. The same elements as those described above will be referred to the same reference numerals in embodiments below, and redundant descriptions will be omitted or simplified.

Figure 13:
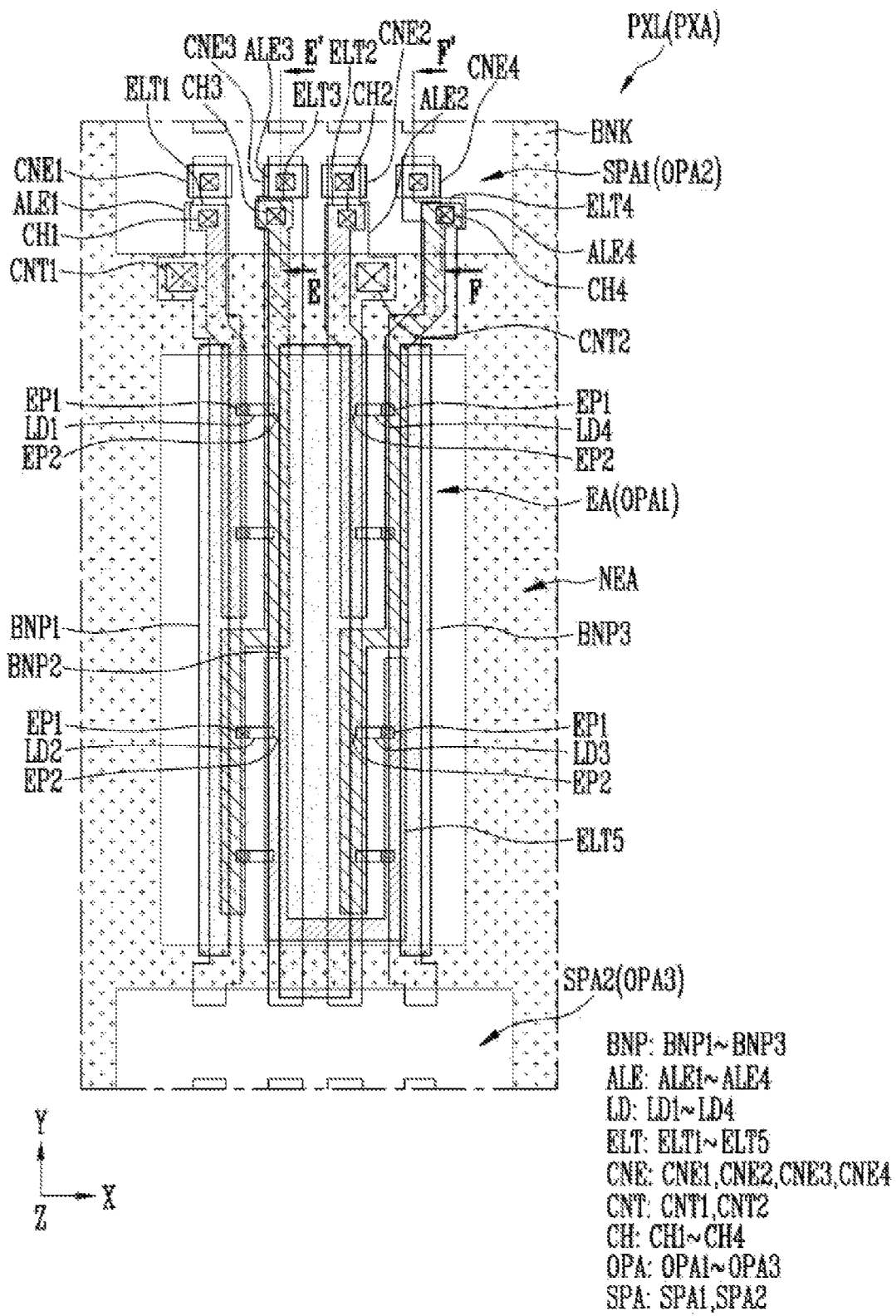
FIG. 13 illustrates a top schematic plan view of a pixel according to an embodiment.
Figure 14:
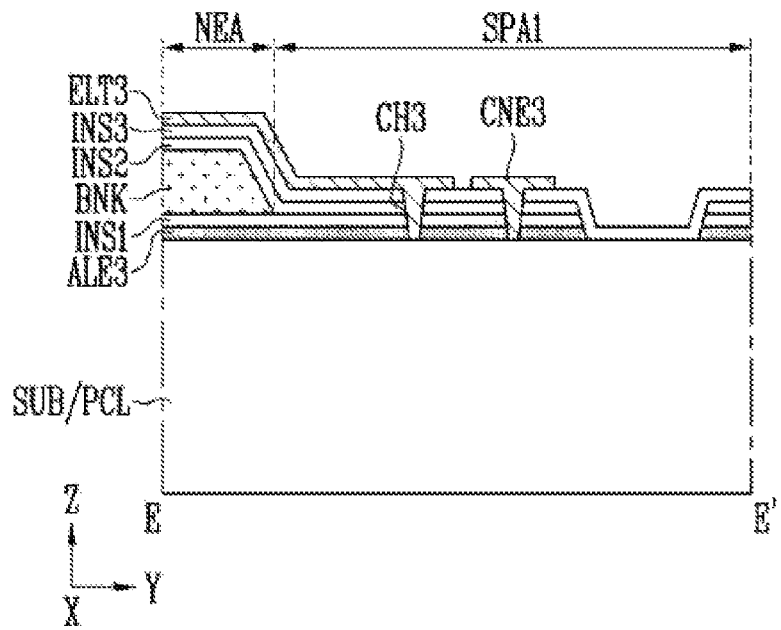
FIG. 14 and FIG. 15 illustrate schematic cross-sectional views taken along line E-E' of FIG. 13.
Figure 15:
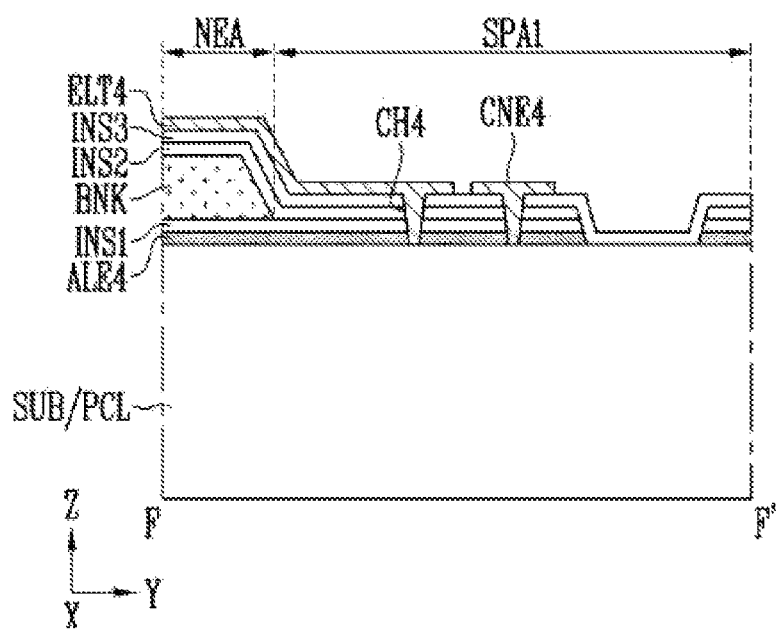
Figure 16:
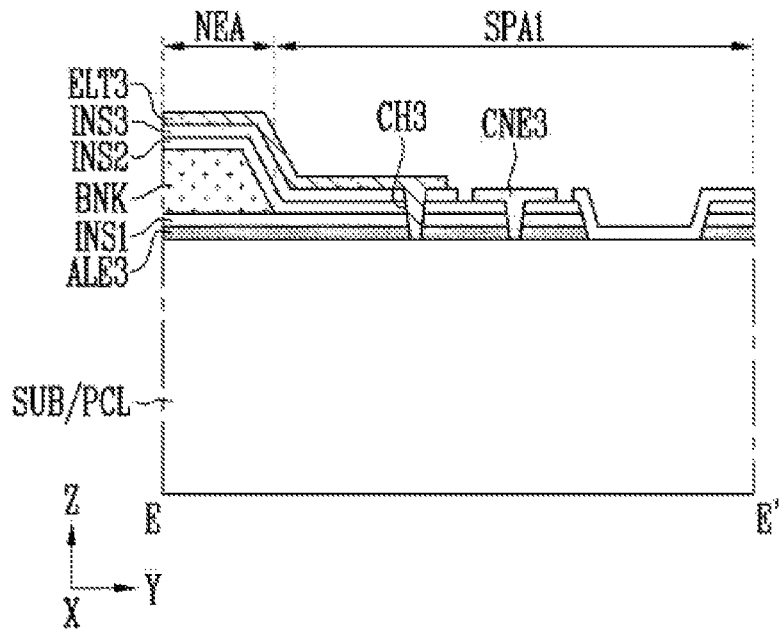
FIG. 16 and FIG. 17 illustrate schematic cross-sectional views taken along line F-F' of FIG. 13.
Figure 17:
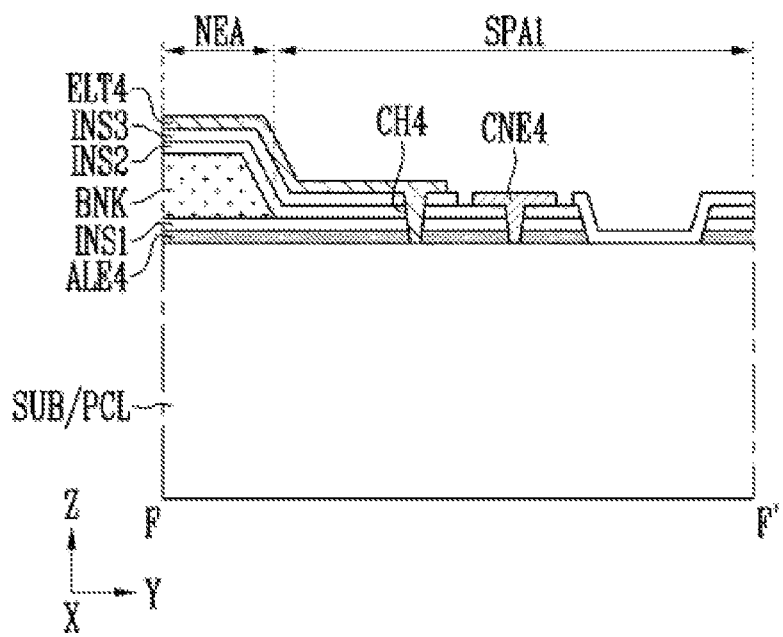

FIG. 13 illustrates a schematic top plan view of a pixel according to an embodiment. FIG. 14 and FIG. 15 illustrate schematic cross-sectional views taken along line E-E' of FIG. 13. FIG. 16 and FIG. 17 illustrate schematic cross-sectional views taken along line F-F of FIG. 13.

Referring to FIG. 13 to FIG. 17, the display device according to an embodiment may be different from embodiments of FIG. 1 to FIG. 12 in that it further may include third and fourth contact electrodes CNE3 and CNE4.

By way of example, the third contact electrode CNE3 may be disposed to overlap the third alignment electrode ALE3 in the first separation area SPA1. The third contact electrode CNE3 may be electrically connected to the third alignment electrode ALE3 through a contact hole formed in the first separation area SPA1. The third contact electrode CNE3 may be disposed to not overlap the third electrode ELT3 described above. For example, the third contact electrode CNE3 may be spaced apart from the third electrode ELT3 in the second direction (Y-axis direction), but is not limited thereto.

The fourth contact electrode CNE4 may be disposed to overlap the fourth alignment electrode ALE4 in the first separation area SPA1. The fourth contact electrode CNE4 may be electrically connected to the fourth alignment electrode ALE4 through a contact hole formed in the first separation area SPA1. The fourth contact electrode CNE4 may be disposed to not overlap the fourth electrode ELT4 described above. For example, the fourth contact electrode CNE4 may be spaced apart from the fourth electrode ELT4 in the second direction (Y-axis direction), but is not limited thereto.

FIG. 13 illustrates the case in which the third and fourth contact electrodes CNE3 and CNE4 are disposed in the first separation area SPA1, but the disclosure is not limited thereto. In an embodiment, some or a part or all of the third and fourth contact electrodes CNE3 and CNE4 may be electrically connected to the third and fourth alignment electrodes ALE3 and ALE4, respectively, in the second separation area SPA2.

The third and fourth contact electrodes CNE3 and CNE4 may be disposed on the second insulation layer INS2 and/or the third insulation layer INS3.

In the embodiment, the third and fourth contact electrodes CNE3 and CNE4 may be disposed on a same layer as the third and fourth electrodes ELT3 and ELT4 described above. For example, as shown in FIG. 14 and FIG. 15, the third and fourth contact electrodes CNE3 and CNE4 may be disposed on the third insulation layer INS3. The resistance of each pixel PXL may be measured through the third and fourth contact electrodes CNE3 and CNE4 exposed on the third insulation layer INS3. For example, the reliability of the display panel PNL may be improved by detecting a change in resistance in each pixel PXL through the third and fourth contact electrodes CNE3 and CNE4 to detect a disconnection or short circuit defect. As described above, in case that the third and fourth contact electrodes CNE3 and CNE4 are formed of a same conductive layer as the third and fourth electrodes ELT3 and ELT4, the third and fourth contact electrodes CNE3 and CNE4 may be formed simultaneously in the same process as the third and fourth electrodes ELT3 and ELT4, but are not limited thereto.

In an embodiment, the third and fourth contact electrodes CNE3 and CNE4 may be disposed on a same layer as the first and second electrodes ELT1 and ELT2 described above. For example, as shown in FIG. 16 and FIG. 17, the third and fourth contact electrodes CNE3 and CNE4 may be disposed on the second the second layer INS2. The third insulation layer INS3 disposed on the second insulation layer INS2 may include an opening exposing the third and fourth contact electrodes CNE3 and CNE4. Accordingly, as described above, a disconnection or short circuit defect may be detected by measuring the resistance of each pixel PXL through the third and fourth contact electrodes CNE3 and CNE4 exposed by the third insulation layer INS3. As described above, in case that the third and fourth contact electrodes CNE3 and CNE4 are formed of a same conductive layer as the first and second electrodes ELT1 and ELT2, the third and fourth contact electrodes CNE3 and CNE4 may be formed simultaneously in the same process as the first and second electrodes ELT1 and ELT2, but are not limited thereto.

Each of the third and fourth contact electrodes CNE3 and CNE4 may be made of various transparent conductive materials. For example, the contact electrodes CNE may include at least one of various transparent materials such as an indium tin oxide (ITO), an indium zinc oxide (IZO), an indium tin zinc oxide (ITZO), a zinc oxide (ZnO), an aluminum zinc oxide (AZO), a gallium zinc oxide (GZO), a zinc tin oxide (ZTO), a gallium tin oxide (GTO), or a fluorine tin oxide (FTO).

According to the above-described embodiment, the reliability of the display panel PNL may be improved by measuring the resistance of each pixel PXL through the contact electrodes CNE including the third and fourth contact electrodes CNE3 and CNE4 to detect a disconnection or short circuit defect. Since a change in resistance may be detected without contacting or directly contacting the alignment electrodes ALE, it is possible to prevent the alignment electrodes ALE from being damaged in the process of measuring the resistance of the pixel PXL. As described above, by disposing the contact electrodes CNE in the separation area SPA, an additional space for forming the contact electrodes CNE is unnecessary, so that a high resolution display device may be readily implemented.

Those skilled in the art will readily appreciate that many modifications are possible without materially departing from the novel teachings and advantages. The embodiments should be considered in a descriptive sense only and not for purposes of limitation. The scope of the disclosure, not only by the detailed description given in the appended claims, and all differences within the equivalent scope will be construed as being included in the disclosure.

What is claimed is:

1. A display device comprising:
    a light emitting area, a non-light emitting area surrounding the light emitting area, and a separation area spaced apart from the light emitting area, the non-light emitting area disposed between the light emitting area and the separation area;
    a bank disposed in the non-light emitting area;
    a first alignment electrode and a second alignment electrode that extend from the light emitting area through the non-light emitting area to the separation area;
    light emitting elements electrically connected to at least one of the first alignment electrode and the second alignment electrode;
    a first contact electrode disposed in the separation area and electrically connected to the first alignment electrode, the first contact electrode disposed over the first alignment electrode; and
    a second contact electrode disposed in the separation area and electrically connected to the second alignment electrode, the second contact electrode disposed over the second alignment electrode.

2. The display device of claim 1, wherein the first contact electrode and the second contact electrode are disposed on a same layer.

3. The display device of claim 1, further comprising:
    a first electrode that electrically connects the first alignment electrode to the light emitting elements; and
    a second electrode that electrically connects the second alignment electrode to the light emitting elements.

4. The display device of claim 3, wherein the first electrode and the second electrode are disposed on a same layer.

5. The display device of claim 3, wherein the first electrode and the first contact electrode are disposed on different layers.

6. The display device of claim 3, wherein the first electrode and the second electrode extend from the light emitting area through the non-light emitting area to the separation area.

7. The display device of claim 3, further comprising:
    an insulation layer disposed between the first alignment electrode and the first electrode.

8. The display device of claim 7, wherein the first contact electrode is electrically connected to the first alignment electrode through a contact hole penetrating the insulation layer.

9. The display device of claim 3, wherein the first electrode and the first contact electrode are disposed on a same layer.

10. The display device of claim 3, further comprising:
    a third alignment electrode and a fourth alignment electrode that extend from the light emitting area through the non-light emitting area to the separation area, wherein the light emitting elements are electrically connected to at least one of the third alignment electrode and the fourth alignment electrode.

11. The display device of claim 10, further comprising:
a third electrode that electrically connects the third alignment electrode to the light emitting elements; and
a fourth electrode that electrically connects the fourth alignment electrode to the light emitting elements.

12. The display device of claim 11, further comprising:
an insulation layer disposed between the first electrode and the third electrode.

13. The display device of claim 12, wherein the first contact electrode is electrically connected to the first alignment electrode through a contact hole penetrating the insulation layer.

14. The display device of claim 12, wherein the insulation layer includes an opening exposing the first contact electrode.

15. The display device of claim 11, wherein the third electrode and the fourth electrode are disposed on a same layer.

16. The display device of claim 11, wherein the third electrode and the first contact electrode are disposed on a same layer.

17. The display device of claim 11, further comprising:
a third contact electrode disposed in the non-light emitting area and electrically connected to the third alignment electrode; and
a fourth contact electrode disposed in the non-light emitting area and electrically connected to the fourth alignment electrode.

18. The display device of claim 17, wherein the third contact electrode and the fourth contact electrode are disposed on a same layer.

19. The display device of claim 17, wherein the third contact electrode and the first contact electrode are disposed on a same layer.

20. The display device of claim 17, wherein the third contact electrode and the third electrode are disposed on a same layer.

* * * * *